(12) United States Patent
Ju

(10) Patent No.: US 12,484,397 B2
(45) Date of Patent: Nov. 25, 2025

(54) DISPLAY APPARATUS

(71) Applicant: Samsung Display Co., Ltd., Yongin-si (KR)

(72) Inventor: Sungbae Ju, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 846 days.

(21) Appl. No.: 17/831,492

(22) Filed: Jun. 3, 2022

(65) Prior Publication Data

US 2023/0146971 A1    May 11, 2023

(30) Foreign Application Priority Data

Nov. 11, 2021   (KR) ................. 10-2021-0155164

(51) Int. Cl.
    *H10K 59/121*    (2023.01)
    *H10K 59/131*    (2023.01)
    *H10K 59/88*     (2023.01)

(52) U.S. Cl.
    CPC .......... *H10K 59/131* (2023.02); *H10K 59/88* (2023.02)

(58) Field of Classification Search
    CPC ..................... H10K 59/121; H10K 59/122
    See application file for complete search history.

(56) References Cited

U.S. PATENT DOCUMENTS

| | | | |
|---|---|---|---|
| 8,188,649 B2 | 5/2012 | Sung et al. | |
| 8,223,095 B2 * | 7/2012 | Kim | G09G 3/006 345/82 |
| 10,304,921 B2 | 5/2019 | Lee et al. | |
| 10,734,452 B1 | 8/2020 | Kim et al. | |
| 10,964,612 B2 | 3/2021 | Lee et al. | |
| 2016/0284771 A1 * | 9/2016 | Hwang | H10K 59/1213 |
| 2021/0027682 A1 | 1/2021 | An et al. | |

FOREIGN PATENT DOCUMENTS

| | | | |
|---|---|---|---|
| EP | 3993039 A1 * | 5/2022 | ......... H10K 59/131 |
| KR | 100864882 B1 | 10/2008 | |
| KR | 1020180138251 A | 12/2018 | |
| KR | 1020190116786 A | 10/2019 | |
| KR | 1020200077254 A | 6/2020 | |
| KR | 20200089379 A | 7/2020 | |
| KR | 102211928 B1 | 1/2021 | |

\* cited by examiner

*Primary Examiner* — Errol V Fernandes
(74) *Attorney, Agent, or Firm* — CANTOR COLBURN LLP

(57) ABSTRACT

A display apparatus includes a display area including a display pixel having an emission area, a peripheral area which is outside of the display area, the peripheral area including a dam, and a first test pixel which is between the display area and the dam and has an emission area, and an encapsulation layer in the display area and extended from the display area to the dam The emission area of the first test pixel in the peripheral area is larger than the emission area of the display pixel in the display area.

20 Claims, 12 Drawing Sheets

DISPLAY APPARATUS

This application claims priority to Korean Patent Application No. 10-2021-0155164, filed on Nov. 11, 2021, and all the benefits accruing therefrom under 35 U.S.C. § 119, the disclosure of which is incorporated by reference herein in its entirety.

BACKGROUND

1. Field

One or more embodiments relate to a display apparatus. More particularly, one or more embodiments relate to a display apparatus capable of easily identifying whether an emission area of pixels is reduced or to what extent an emission area of pixels is reduced.

2. Description of the Related Art

A large number of pixels are positioned in a display area of a display apparatus, and these pixels may be damaged by moisture or oxygen from the outside. In order to prevent such damage, a thin-film encapsulation layer covers the display area of the display apparatus.

SUMMARY

Where a thin-film encapsulation layer may cover a display area of the display apparatus, impurities such as moisture or the like penetrate from the periphery of the display area and into the display area, and an emission area of pixels adjacent to (or closest to) the periphery of the display apparatus may decrease. When the emission area of the pixels is reduced, the quality of an image implemented by the display apparatus may deteriorate. However, in the case of a high-resolution display apparatus of the related art, it is not easy to inspect the extent to which an emission area of pixels is reduced.

To solve various problems including the aforementioned problem, one or more embodiments provide a display apparatus capable of easily identifying whether, or to what extent, an emission area of pixels is reduced. However, the embodiments are examples, and do not limit the scope of the disclosure.

Additional aspects will be set forth in part in the description which follows and, in part, will be apparent from the description, or may be learned by practice of the presented embodiments of the disclosure.

According to one or more embodiments, a display apparatus includes a substrate, a display area and a peripheral area, the display area being on the substrate and including a first pixel, and the peripheral area being on an outside of the display area, a dam portion which surrounds the display area, a thin-film encapsulation layer covering the display area and at least a portion of the dam portion, and a second pixel between the display area and the dam portion, the second pixel having an emission area larger than an emission area of the first pixel included in the display area.

The second pixel may be adjacent to a first corner of the display area.

The display apparatus may further include pads in the peripheral area to be adjacent to one side of the display area, where the first corner may be on an opposite side of the display area.

The display apparatus may further include a third pixel adjacent to a second corner of the display area, the second corner being different from the first corner, and the third pixel being between the display area and the dam portion and having an emission area larger than the emission area of the first pixel in the display area.

The display apparatus may further include pads in the peripheral area to be adjacent to one side of the display area, where the second corner may be on an opposite side of the display area and may face the first corner.

The display apparatus may further include a fourth pixel and a fifth pixel between the display area and the dam portion, the fourth pixel and the fifth pixel each having an emission area larger than the emission area of the first pixel included in the display area, where the fourth pixel may be adjacent to a third corner of the display area, the third corner being different from the first corner and the second corner, and the fifth pixel may be adjacent to a fourth corner of the display area, the fourth corner being different from the first corner, the second corner and the third corner.

The display apparatus may further include pads in the peripheral area to be adjacent to one side of the display area, where the third corner may be on the one side of the display area, and the fourth corner may be on the one side of the display area and faces the third corner.

The display apparatus may further include a sixth pixel adjacent to an edge of the display area, the edge being between the first corner and the second corner, and the sixth pixel being between the display area and the dam portion and having an emission area larger than the emission area of the first corner included in the display area.

The display apparatus may further include pads in the peripheral area to be adjacent to one side of the display area, where the edge may be on an opposite side of the display area.

The first pixel may include a plurality of first subpixels, the second pixel may include a plurality of second subpixels, and an emission area of a subpixel having a smallest emission area among the plurality of second subpixels may be larger than an emission area of a subpixel having a largest emission area among the plurality of first subpixels.

Emission areas of the plurality of second subpixels may be same.

The first pixel may include a first light-emitting element, the second pixel may include a second light-emitting element, and the first light-emitting element and the second light-emitting element may be on a same layer.

The display apparatus may further include a detection wire on the outside of the display area to surround at least a portion of the display area, the detection wire being electrically connected to the second pixel.

The second pixel may include a pixel electrode, an intermediate layer and an opposite electrode, and the detection wire may be electrically connected to the pixel electrode of the second pixel.

The substrate may include a through hole, and the detection wire may include a through hole detection wire, at least a portion of which is adjacent to the through hole.

The display apparatus may further include a semiconductor layer on the substrate, a gate electrode on a first insulating layer, the first insulating layer covering the semiconductor layer, and a drain electrode on a second insulating layer, the second insulating layer covering the gate electrode, where the detection wire may be on the second insulating layer in a same manner as the drain electrode.

According to one or more embodiments, a display apparatus includes a substrate including a display area and a peripheral area, the peripheral area being on an outside of the display area, a first pixel in the display area, a dam portion which surrounds the display area, a thin-film encapsulation layer covering the display area and at least a portion of the dam portion, and a plurality of second pixels between the display area and the dam portion, the plurality of second pixels being arranged along the outside of the display area to surround at least a portion of the display area, and each having an emission area larger than an emission area of the first pixel.

The display apparatus may further include a detection wire on the outside of the display area to surround at least a portion of the display area, the detection wire being electrically connected to each of the plurality of second pixels.

Each of the plurality of second pixels may include a pixel electrode, an intermediate layer and an opposite electrode, and the detection wire may be electrically connected to the pixel electrode of each of the plurality of second pixels.

The substrate may include a through hole, and the detection wire may include a through hole detection wire, at least a portion of which is adjacent to the through hole.

Other aspects, features, and advantages of the disclosure will become more apparent from the detailed description, the claims, and the drawings.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION

Figure 1:
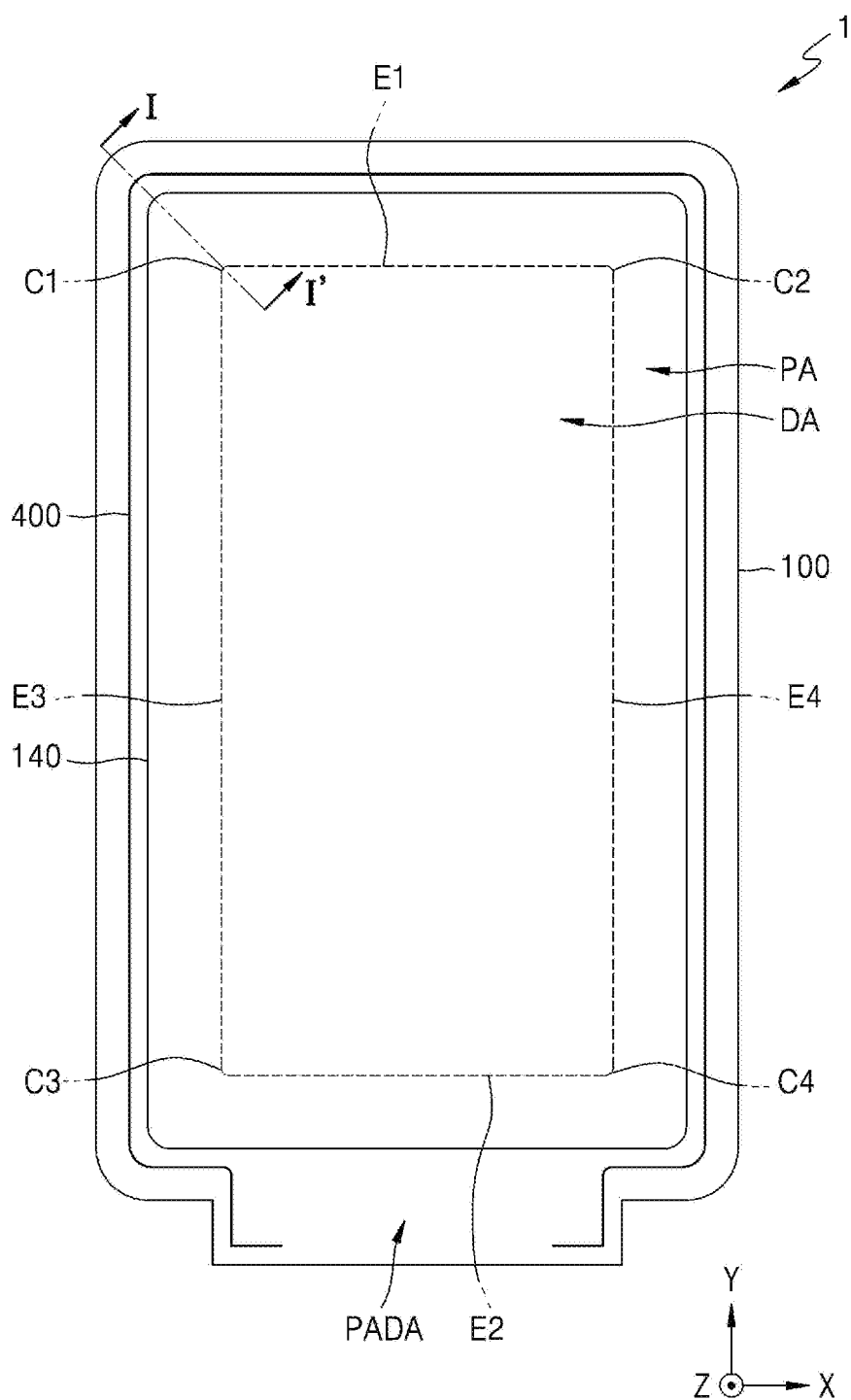
FIG. 1 is a schematic plan view of a display apparatus according to an embodiment.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As the present disclosure allows for various changes, embodiments will be illustrated in the drawings and described in the written description. Advantages and features of the disclosure, and implementation methods thereof will be clarified through following embodiments described with reference to the accompanying drawings. The disclosure may, however, be embodied in many different forms and should not be construed as limited to the embodiments set forth herein.

Hereinafter, embodiments will be described in detail with reference to the accompanying drawings, where the same or corresponding elements are denoted by the same reference numerals throughout and a repeated description thereof is omitted. As used herein, a reference number may indicate a singular element or a plurality of the element. For example, a reference number labeling a singular form of an element within the drawing figures may be used to reference a plurality of the singular element within the text of specification.

It will be understood that when an element, such as a layer, a film, an area, or a plate, is referred to as being related to another element such as being "on" another element, the element may be directly on the other element or intervening elements may be present therebetween. In contrast, when an element, such as a layer, a film, an area, or a plate, is referred to as being related to another element such as being "directly on" another element, no other element or intervening elements are therebetween. Sizes of elements in the drawings may be exaggerated or contracted for convenience of explanation. In other words, since sizes and thicknesses of elements in the drawings are arbitrarily illustrated for convenience of explanation, the following embodiments are not limited thereto.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the following embodiments, the x-axis, the y-axis and the z-axis are not limited to three axes of the rectangular coordinate system, and may be interpreted in a broader sense. For example, the x-axis, the y-axis, and the z-axis may be perpendicular to one another or may represent different directions that are not perpendicular to one another.

Figure 2:
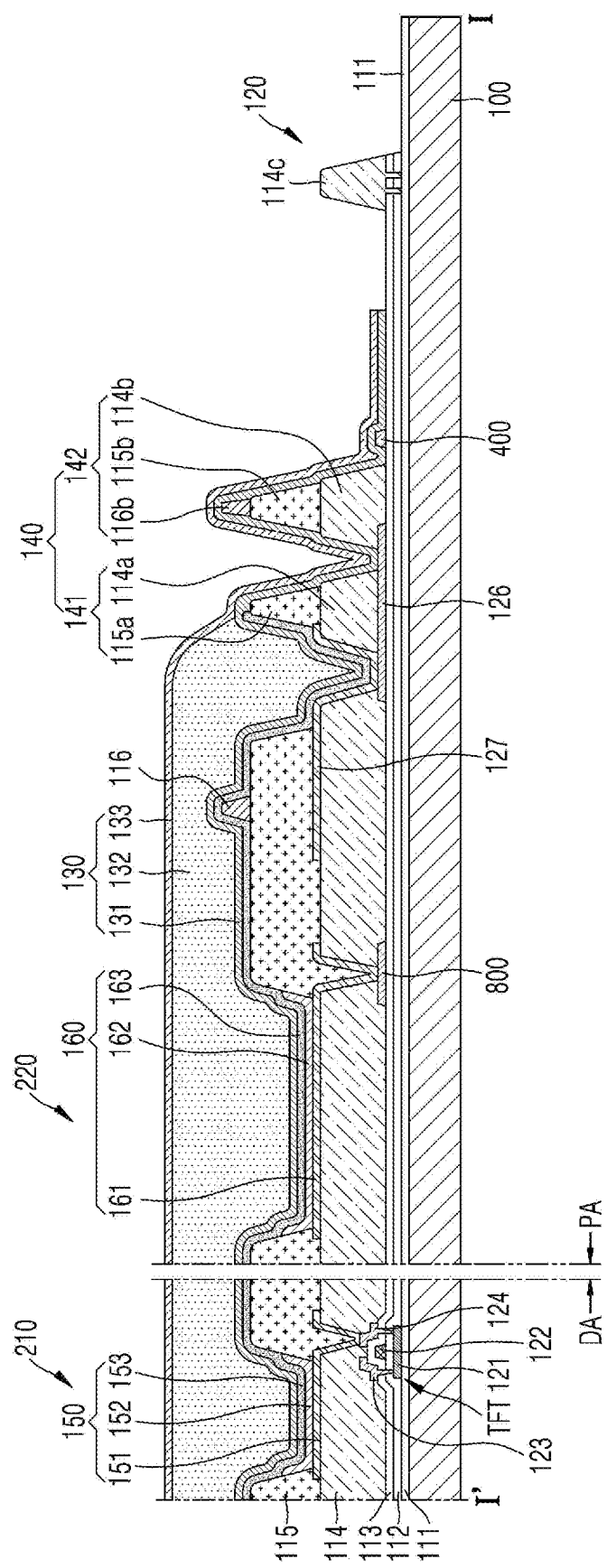
FIG. 2 is a schematic cross-sectional view of a cross-section of the display apparatus taken along a line I-I' of FIG. 1.

FIG. 1 is a schematic plan view of a display apparatus 1 according to an embodiment, and FIG. 2 is a schematic cross-sectional view of a cross-section of the display apparatus 1 taken along a line I-I' of FIG. 1.

The display apparatus 1 according to the present embodiment includes a display area DA in which a plurality of pixels are positioned, and a peripheral area PA positioned outside the display area DA, as illustrated in FIG. 1. This may mean that a substrate 100 included in the display apparatus 1 includes the display area DA and the peripheral area PA. The peripheral area PA includes a pad area PADA, which is an area to which various electronic devices or printed circuit boards are electrically attached. Various components or layers of the display apparatus 1 (such as the substrate 100) may include a display area DA and a peripheral area PA corresponding to those described herein.

FIG. 1 may be understood as a plan view of a state of a substrate 100 which is flat, or the like, such as during a manufacturing process. In a final display apparatus or an electronic apparatus such as a smartphone including a display apparatus 1, a portion of a substrate 100 may be bent in order to minimize an area (e.g., planar area) of the peripheral area PA recognized from outside the electronic apparatus such as by a user.

In an embodiment, for example, the peripheral area PA may include a bending area between the pad area PADA and the display area DA. In this case, the substrate 100 is bendable at the bending area. The electronic apparatus (or the display apparatus and/or the substrate 100) which is bent at the bending area may dispose a portion of the pad area PADA overlapping the display area DA along a thickness direction of the electronic apparatus (e.g., along the z direction). In this regard, a bending direction is set so that the pad area PADA does not cover the display area DA, but the pad area PADA is positioned behind the display area DA. Accordingly, from a front of the bent electronic apparatus, the display area DA may be recognized to occupy most of a total planar area of the display apparatus 1.

The substrate 100 may include various flexible or bendable materials. The substrate 100 may include, for example, a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. Various modifications may be made. In an embodiment, for example, the substrate 100 may have a multi-layered structure including two layers each including a polymer resin, and a barrier layer between the two layers, the barrier layer including an inorganic material (e.g., silicon oxide, silicon nitride, or silicon oxynitride). Furthermore, when the substrate 100 is not bendable, the substrate 100 may include glass or the like.

The display area DA may have a substantially rectangular or square shape. However, as illustrated in FIG. 1, the display area DA may not have sharp corners. In detail, the display area DA may include a first edge E1 and a second edge E2 facing each other, and a third edge E3 and a fourth edge E4 facing each other and each positioned between the first edge E1 and the second edge E2. The various edges may correspond to a boundary between the display area DA and the peripheral area PA, without being limited thereto.

The pad area PADA is adjacent to the second edge E2 from among the first edge E1 through the fourth edge E4. The first edge E1 and the third edge E3 may contact or meet each other to form a first corner C1, and the first corner C1 may have a round shape. The first edge E1 may contact the fourth edge E4 to form a second corner C2, the second edge E2 may contact the third edge E3 to form a third corner C3, and the second edge E2 may contact the fourth edge E4 to form a fourth corner C4. The second corner C2, the third corner C3, and the fourth corner C4 may also have round shapes.

As illustrated in FIG. 2, a first light-emitting element 150, and a first pixel 210 (e.g., a display pixel) including a thin-film transistor TFT to which the first light-emitting element 150 is electrically connected, may be positioned in the display area DA of the substrate 100. FIG. 2 illustrates that an organic light-emitting element is positioned in the display area DA as the first light-emitting element 150. When the organic light-emitting element is electrically connected to the thin-film transistor TFT, it may be mean that a first pixel electrode 151 is electrically connected to the thin-film transistor TFT.

As illustrated in FIG. 2, the thin-film transistor TFT in the display area DA includes a semiconductor layer 121, a gate electrode 122, a source electrode 123 and a drain electrode 124, the semiconductor layer 121 including amorphous silicon, polycrystalline silicon, an oxide semiconductor material, or an organic semiconductor material. In order to secure insulation between the semiconductor layer 121 and the gate electrode 122, a first insulating layer 112 may be between the semiconductor layer 121 and the gate electrode 122, the first insulating layer 112 including an inorganic material such as silicon oxide, silicon nitride, and/or silicon oxynitride. In addition, a second insulating layer 113 may be arranged over the gate electrode 122, the second insulating layer 113 including an inorganic material such as silicon oxide, silicon nitride, and/or silicon oxynitride. The source electrode 123 and the drain electrode 124 may be arranged on the second insulating layer 113. An insulating layer including the aforementioned inorganic material may be formed by using chemical vapor deposition (CVD) or atomic layer deposition (ALD). This applies to the following embodiments and modifications thereof.

A buffer layer 111 may be between the thin-film transistor TFT and the substrate 100, the buffer layer 111 including an inorganic material such as silicon oxide, silicon nitride, and/or silicon oxynitride. The buffer layer 111 may increase the flatness of the upper surface of the substrate 100, or may prevent or minimize impurities from the substrate 100 or the like from penetrating into the semiconductor layer 121 of the thin-film transistor TFT.

In addition, a planarization layer 114 may be arranged on the thin-film transistor TFT. In an embodiment, for example, when an organic light-emitting element is arranged above the thin-film transistor TFT as illustrated in FIG. 2, the planarization layer 114 may substantially planarize the upper surface of the thin-film transistor TFT. The planarization layer 114 may include an organic material such as acryl, benzocyclobutene (BCB), or hexamethyldisiloxane (HMDSO). Although the planarization layer 114 is illustrated as a monolayer in FIG. 2, the planarization layer 114 may include layers. Various modifications may be made.

In the display area DA of the substrate 100, the first light-emitting element 150 may be positioned on the planarization layer 114. The first light-emitting element 150 may be, for example, an organic light-emitting element including the first pixel electrode 151 (e.g., a pixel electrode), a first opposite electrode 153 (e.g., an opposite electrode), and a first intermediate layer 152 (e.g., an intermediate layer) positioned therebetween and including a light-emitting layer.

As illustrated in FIG. 2, the first pixel electrode 151 may be electrically connected to the thin-film transistor TFT by contacting any one of the source electrode 123 and the drain electrode 124 through an opening formed in the planarization layer 114 or the like. The first pixel electrode 151 includes a light-transmitting conductive layer including a light-transmitting conductive oxide such as indium tin oxide (ITO), indium oxide ($In_2O_3$), or indium zinc oxide (IZO), and a reflective layer including a metal such as aluminum (Al) or silver (Ag). In an embodiment, for example, the first pixel electrode 151 may have a three-layered structure of ITO/Ag/ITO.

A pixel-defining layer 115 may be arranged on the planarization layer 114. The pixel-defining layer 115 includes an opening corresponding to each subpixel within a respective pixel, that is, an opening through which at least a central portion of the first pixel electrode 151 is exposed, and thus defines the respective pixel. Also, as in FIG. 2, the pixel-defining layer 115 prevents an electrical arc or the like from occurring at the edge of the first pixel electrode 151 by increasing a distance between an edge of the first pixel electrode 151 and the first opposite electrode 153 which is over the first pixel electrode 151. The pixel-defining layer 115 may include an organic material such as polyimide or HMDSO.

A spacer 116 may be arranged on the pixel-defining layer 115 of the peripheral area PA. The spacer 116 protrudes from the pixel-defining layer 115 and toward a thin-film encapsulation layer 130, and may prevent defects to underlying layers due to damage to a mask or the like during a process. The spacer 116 may include an organic material such as polyimide or HMDSO.

The first intermediate layer 152 of the organic light-emitting element may include a low molecular weight material or a polymer material. When the first intermediate layer 152 includes a low molecular weight material, the first intermediate layer 152 may have a single or stacked structure in which a hole injection layer (HIL), a hole transport layer (HTL), an emission layer (EML), an electron transport layer (ETL), and an electron injection layer (EIL) are stacked, and may be formed by using vacuum deposition. When the first intermediate layer 152 includes a polymer material, the first intermediate layer 152 may have a structure including an HTL and an EML. In this case, the HTL may include poly(3,4-ethylenedioxythiophene) (PEDOT), and the EML may include a polymer material such as a polyphenylene vinylene (PPV)-based material or a polyfluorene-based material. The first intermediate layer 152 may be formed by using screen printing, inkjet printing, laser-induced thermal imaging (LITI), or the like. However, the first intermediate layer 152 is not limited thereto, and may have any of various other structures. The first intermediate layer 152 may include a layer that is formed as one body over a plurality of first pixel electrodes 151, or may include a layer that is patterned to correspond to each of a plurality of first pixel electrodes 151.

The first opposite electrode 153 is arranged over the display area DA and may be arranged to cover the display area DA. That is, the first opposite electrode 153 may be formed as one body in a plurality of organic light-emitting elements and may correspond to the plurality of first pixel electrodes 151. The first opposite electrode 153 may include a light-transmitting conductive layer including ITO, $In_2O_3$, or IZO, and may also include a semi-transparent layer including a metal such as Al or Ag. In an embodiment, for example, the first opposite electrode 153 may be a semi-transparent layer including magnesium-silver (MgAg).

Also, the first opposite electrode 153 may be formed as one body with a second opposite electrode 163 arranged over the peripheral area PA. In this case, the first opposite electrode 153 may correspond to the first pixel electrode 151 and a second pixel electrode 161 (e.g., together as a pixel electrode). However, one or more embodiments are not limited thereto.

The first opposite electrode 153 is electrically connected to a power supply line 126 positioned in the peripheral area PA. In detail, as illustrated in FIG. 2, the first opposite electrode 153 may be electrically connected to the power supply line 126 through openings of the planarization layer 114 and the pixel-defining layer 115, the planarization layer 114 covering the power supply line 126. Accordingly, the power supply line 126 may be configured to apply a power voltage to the first light-emitting element 150. The power supply line 126 may include the same material as the source electrode 123 and the drain electrode 124. A connection conductive layer 127 including the same material as the first pixel electrode 151 may be between the first opposite electrode 153 and the power supply line 126.

A dam portion 140 may be positioned in the peripheral area PA of the substrate 100. In detail, the dam portion 140 may be arranged to cover at least a portion of the power supply line 126 and to surround the display area DA. The dam portion 140 may include a plurality of dams including a first dam 141 closest to the display area DA, and a second dam 142 which is between the first dam 141 and one end of the substrate 100.

The first dam 141 may be positioned over the power supply line 126. The first dam 141 may have a structure in which a first layer 114a including a disconnected portion of the planarization layer 114 and a second layer 115a including a disconnected portion of the pixel-defining layer 115 are stacked in a direction away from the substrate 100. Since the first layer 114a that directly contacts the upper surface of the power supply line 126 includes an organic material having a higher adhesive force to a metal than an inorganic material, the first dam 141 may be stably arranged on the power supply line 126. However, one or more embodiments are not limited thereto, and the first dam 141 may include a different material and may have a different height. As being in contact, elements may for an interface therebetween without being limited thereto.

The second dam 142 may be positioned outside the first dam 141 (e.g., further from the display area DA than the first dam 141) to cover one end of the power supply line 126 which is furthest from the display area DA. The second dam 142 may have a structure in which a first layer 114b including a disconnected portion of the planarization layer 114, a second layer 115b including a disconnected portion of the pixel-defining layer 115, and a third layer 116b including the spacer 116 are stacked in order in a direction from the substrate 100.

Various components or layers on the substrate 100 may have a thickness or a height relative to a reference, such as the substrate 100. Referring to FIG. 2, for example, a height of the second dam 142 may be greater than a height of the first dam 141.

Since the first layer 114b of the second dam 142 covers a distal end of the power supply line 126, damage to the power supply line 126 may be prevented in a backplane manufacturing process using heat or chemicals. Also, the second dam 142 may prevent or minimize leakage of a material for forming an organic encapsulation layer 132 to the outside of the dam portion 140 in a process of forming the organic encapsulation layer 132. In addition, since the second dam 142 has a larger height than the first dam 141, in a manufacturing process of forming the thin-film encapsulation layer 130 by using a metal mask (not illustrated), the second dam 142 may prevent damage to surfaces of the first opposite electrode 153 and the second opposite electrode 163 when the metal mask contacts the surfaces of the first opposite electrode 153 and the second opposite electrode 163.

Although FIG. 2 illustrates that the dam portion 140 includes the first dam 141 and the second dam 142, that is, two dams, one or more embodiments are not limited thereto. The number, height, material, etc. of the plurality of dams may be variously modified.

The thin-film encapsulation layer 130 may cover the display area DA and extend from the display area DA and into the peripheral area PA. In detail, the thin-film encapsulation layer 130 may cover the display area DA and may also cover at least a portion of the dam portion 140. The thin-film encapsulation layer 130 may cover the display area DA to protect organic light-emitting elements in the display area DA from moisture or oxygen from the outside. The thin-film encapsulation layer 130 may include a first inorganic encapsulation layer 131, an organic encapsulation layer 132, and a second inorganic encapsulation layer 133 as illustrated in FIG. 2. Various layers from the substrate 100 through the thin-film encapsulation layer 130 may define a display panel, without being limited thereto.

The first inorganic encapsulation layer 131 may entirely cover the first opposite electrode 153 and the second opposite electrode 163 (e.g., cover an entirety of the opposite electrode), and may include silicon oxide, silicon nitride, and/or silicon oxynitride.

Other layers such as a capping layer (not illustrated), which improves light efficiency and protects light-emitting elements, may be respectively between the first inorganic encapsulation layer 131, and the first opposite electrode 153 and the second opposite electrode 163, as necessary. In an embodiment, for example, in order to improve light efficiency, the capping layer (not illustrated) may include one or more organic materials or inorganic materials among silicon oxide ($SiO_2$), silicon nitride ($SiN_x$), zinc oxide ($ZnO_2$), titanium oxide ($TiO_2$), zirconium oxide ($ZrO_2$), ITO, IZO, tris-8-hydroxyquinoline aluminum (Alq3), copper phthalocyanine (CuPc), 4,4'-Bis(N-carbazolyl)-1,1'-biphenyl (CBP), and N,N'-di-1-naphthyl-N,N'-diphenylbenzidine (a-NPB). In an embodiment, the capping layer (not illustrated) may cause a plasmon resonance phenomenon to occur with respect to light generated by the first light-emitting element 150. In an embodiment, for example, the capping layer (not illustrated) may include nanoparticles.

Moreover, the capping layer (not illustrated) may prevent damage to the first light-emitting element 150 and the second light-emitting element 160 (e.g., a plurality of light-emitting elements) due to heat, plasma, or the like generated by a CVD process or a sputtering process for forming the thin-film encapsulation layer 130. In an embodiment, for example, the capping layer (not illustrated) may include an epoxy-based material including at least one of a bisphenol-type epoxy resin, an epoxidized butadiene resin, a fluorine-type epoxy resin, and a novolac epoxy resin.

Also, a layer (not illustrated) including lithium fluoride (LiF) or the like may be between the first inorganic encapsulation layer 131 and the capping layer (not illustrated), as necessary.

Since the first inorganic encapsulation layer 131 is formed along a profile of the structure thereunder, the upper surface of the first inorganic encapsulation layer 131 may have the same profile and may not be flat as illustrated in FIG. 2. The organic encapsulation layer 132 may cover the first inorganic encapsulation layer 131, which is not flat, and the upper surface of the organic encapsulation layer 132 may be substantially flat.

The organic encapsulation layer 132 may include one or more materials selected from polyethylene terephthalate, polyethylene naphthalate, polycarbonate, polyimide, polyethylene sulfonate, polyoxymethylene, polyarylate, polyacrylate, and hexamethyldisiloxane.

The second inorganic encapsulation layer 133 may cover the organic encapsulation layer 132 and include silicon oxide, silicon nitride, silicon oxynitride, and/or the like. The second inorganic encapsulation layer 133 is deposited to directly contact the first inorganic encapsulation layer 131 in an edge area of the display apparatus 1 which is furthest from the display area DA. Accordingly, the various inorganic layers extend along an exposed side surface of the organic encapsulation layer 132 such that the organic encapsulation layer 132 may not be exposed to the outside of the display apparatus 1 at the edge area.

As described above, the thin-film encapsulation layer 130 includes the first inorganic encapsulation layer 131, the organic encapsulation layer 132, and the second inorganic encapsulation layer 133. Due to the multi-layered structure, even if a crack occurs in the thin-film encapsulation layer 130, the crack may not be connected between the first inorganic encapsulation layer 131 and the organic encapsulation layer 132 or between the organic encapsulation layer 132 and the second inorganic encapsulation layer 133. Accordingly, the formation of a path through which moisture or oxygen from the outside penetrates into the display area DA may be prevented or reduced.

A second pixel 220 including a second light-emitting element 160 may be positioned in the peripheral area PA of the substrate 100. In detail, the second pixel 220 may be between the display area DA and the dam portion 140. The second light-emitting element 160 may be positioned on the planarization layer 114, like the first light-emitting element 150 of the first pixel 210. The second light-emitting element 160 may be, for example, an organic light-emitting element including the second pixel electrode 161, the second opposite electrode 163, and a second intermediate layer 162 positioned therebetween and including a light-emitting layer. The second pixel electrode 161, the second intermediate layer 162, and the second opposite electrode 163 of the second light-emitting element 160 may include the same material and be positioned on the same layer as a corresponding one of the first pixel electrode 151, the first intermediate layer 152, and the first opposite electrode 153 of the first light-emitting element 150, as described above. The second pixel 220 may be electrically connected to a detection wire 400 through a first connection wire 800.

Various components or layers on the substrate 100 may have a size defined by one or more dimensions taken along the substrate 100, such as one dimension along the x direction or the y direction (e.g., a width), or an area as a product of dimensions along two directions (e.g., planar area). Referring to FIG. 2, an emission area of the second pixel 220 may be larger than an emission area of the first pixel 210. The second pixel 220 may include the second light-emitting element 160, and the emission area of the second pixel 220 may refer to an area of a portion of the second pixel 220 emitting light at the second light-emitting element 160 when viewed in a direction perpendicular to the substrate 100 (e.g., along the thickness direction). The first pixel 210 may include the first light-emitting element 150, and the emission area of the first pixel 210 may refer to an area of a portion of the first pixel 210 emitting light at the first light-emitting element 150 when viewed in a direction perpendicular to the substrate 100.

When impurities such as moisture or the like penetrate into a display area DA of a display apparatus 1, pixels positioned in the display area DA may have a reduced emission area due to the impurities penetrating into the display area DA. When the emission area of the pixels is reduced, the quality of an image implemented by the display apparatus 1 may deteriorate. In addition, in the case of a high-resolution display apparatus, since an emission area of pixels is small, it may not be easy to visually test whether, or to what extent, the emission area is reduced.

However, the display apparatus 1 according to one or more embodiment includes the second pixel 220 adjacent to the display area DA as described above. The second pixel 220 may be a pixel of the peripheral area PA which is closest to the display area DA, without being limited thereto. The second pixel 220 has an emission area larger than the emission area of the first pixel 210 included in the display area DA (e.g., a pixel of the display area DA which is closest to the peripheral area PA). Accordingly, visually testing whether, or to what extent, the emission area of the second pixel 220 is reduced may be easier than visually testing whether or to what extent the emission area of the first pixel 210 is reduced. Moreover, when an emission area of a pixel is larger than or equal to a reference area, testing whether or to what extent the emission area is reduced may be automated. Accordingly, a test of defects caused by impurities such as moisture or the like during a manufacturing process may be quickly and accurately performed.

Moreover, as illustrated in FIG. 2, the detection wire 400 may be positioned in the peripheral area PA of the substrate 100. In detail, the detection wire 400 may extend along the outside of the dam portion 140 arranged to surround the display area DA, and surround at least a portion of the display area DA. The detection wire 400 may be used to identify whether a crack is generated in a display panel. The detection wire 400 may be electrically connected to the second pixel electrode 161 through the first connection wire 800. A detailed description of the detection wire 400 will be described below.

Moreover, a crack prevention dam 120 may be arranged at a periphery of the detection wire 400 and closer to an outer edge of the display apparatus 1. The crack prevention dam 120 may reduce the extension of a crack occurring in the substrate 100, to the display area DA. The crack prevention dam 120 may include at least one slit (or recess) formed (or provided) in the first insulating layer 112 and the second insulating layer 113, and cladding 114c covering the slit. The slit may be formed in a direction crossing the upper surface of the substrate 100, and the cladding 114c may be formed as a portion of the planarization layer 114, the portion disconnected from other portions of the planarization layer 114. However, one or more embodiments are not limited thereto.

FIGS. 3, 4, 5, 6 and 7 are schematic plan views of position of test pixels within the display apparatus 1, according to embodiments.

Figure 3:
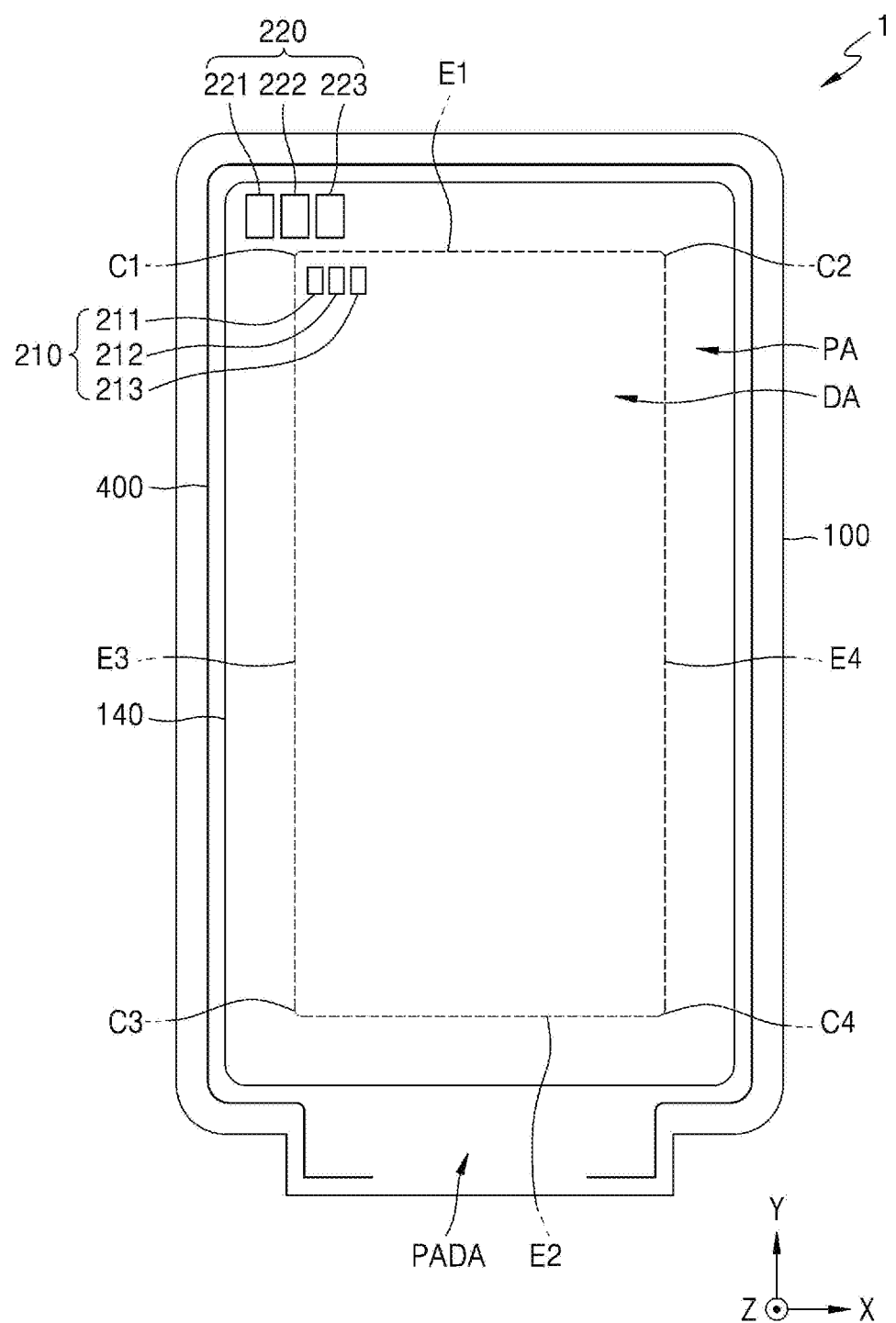
FIG. 3 is a schematic plan view of a position of a second pixel in a display apparatus, according to an embodiment.

As illustrated in FIG. 3, the second pixel 220 may include a second-first subpixel 221, a second-second subpixel 222, and a second-third subpixel 223 (e.g., a plurality of second subpixels). Each of the second-first subpixel 221, the second-second subpixel 222, and the second-third subpixel 223 may emit light in a different wavelength band. The second-first subpixel 221 may emit light having a wavelength of a first wavelength band. The first wavelength band may be, for example, about 630 nanometers (nm) to about 780 nm. The second-second subpixel 222 may emit light having a wavelength of a second wavelength band that is different from the first wavelength band. The second wavelength band may be, for example, about 495 nm to about 570 nm. The second-third subpixel 223 may emit light having a wavelength of a third wavelength band that is different from the first wavelength band and the second wavelength band. The third wavelength band may be, for example, about 450 nm to about 495 nm.

The first pixel 210 positioned in the display area DA may include a first-first subpixel 211, a first-second subpixel 212, and a first-third subpixel 213 (e.g., a plurality of first subpixels). Each of the first-first subpixel 211, the first-second subpixel 212, and the first-third subpixel 213 may emit light in a different wavelength band. In an embodiment, for example, the first-first subpixel 211 may emit light having a wavelength of the first wavelength band, the first-second subpixel 212 may emit light having a wavelength of the second wavelength band, and the first-third subpixel 213 may emit light having a wavelength of the third wavelength band.

In the display apparatus 1 according to an embodiment, an emission area of a subpixel having the smallest emission area among the second-first subpixel 221, the second-second subpixel 222, and the second-third subpixel 223 may be larger than an emission area of a subpixel having the largest emission area among the first-first subpixel 211, the first-second subpixel 212, and the first-third subpixel 213. Each of the second-first subpixel 221, the second-second subpixel 222, and the second-third subpixel 223 may have a different emission area (e.g., a planar area along a plane).

In an embodiment, for example, an emission area of the second-second subpixel 222 may be larger than an emission area of the second-first subpixel 221, and the emission area of the second-third subpixel 223 may be larger than an emission area of the second-second subpixel 222. This may be equally applied to the first-first subpixel 211, the first-second subpixel 212, and the first-third subpixel 213. That is, an emission area of the first-second subpixel 212 may be larger than an emission area of the first-first subpixel 211, and the emission area of the first-third subpixel 213 may be larger than an emission area of the first-second subpixel 212. In this case, the emission area of the second-first subpixel 221, which is the subpixel having the smallest emission area, among the second-first subpixel 221, the second-second subpixel 222 and the second-third subpixel 223, may be larger than the emission area of the first-third subpixel 213, which is the subpixel having the largest emission area among the first-first subpixel 211, the first-second subpixel 212, and the first-third subpixel 213.

Moreover, each of the second-first subpixel 221, the second-second subpixel 222, and the second-third subpixel 223 may have the same emission area. That is, the emission area of the second-first subpixel 221 may be equal to the emission area of the second-second subpixel 222, and the emission area of the second-second subpixel 222 may be equal to the emission area of the second-third subpixel 223. In this case, the emission area of the second-first subpixel 221 may be larger than the emission area of the first-third subpixel 213, which is the subpixel having the largest emission area among the first-first subpixel 211, the first-second subpixel 212, and the first-third subpixel 213.

In the case of the display apparatus 1 according to an embodiment, since the emission area of the subpixel having the smallest emission area among the second-first subpixel 221, the second-second subpixel 222, and the second-third subpixel 223 is larger than the emission area of the subpixel having the largest emission area among the first-first subpixel 211, the first-second subpixel 212, and the first-third subpixel 213, each of the emission areas of the second subpixels is always larger than each of the emission areas of the first subpixels arranged in the display area DA. Accordingly, when the second pixel 220 including the second subpixels is used as a first test pixel, rather than the first pixel 210 including the first subpixels, a test of defects caused by impurities such as moisture or the like may be quickly and accurately performed.

In the display apparatus 1 according to an embodiment, as illustrated in FIG. 3, the second pixel 220 may be adjacent to the first corner C1 of the display area DA. In detail, the first corner C1 may be spaced apart from the pad area PADA positioned in the peripheral area PA by a distance in a first direction (+y direction). That is, the first corner C1 may be a corner positioned at the upper left of the display area DA.

Impurities may penetrate into the display area DA through a bonding surface between the thin-film encapsulation layer 130 and a layer which is arranged under the thin-film encapsulation layer 130. A bonding force between the first inorganic encapsulation layer 131 of the thin-film encapsulation layer 130, and a layer arranged under the first inorganic encapsulation layer 131, may be lower in an area adjacent to a corner of the display area DA than in an area adjacent to an edge (e.g., non-corner) of the display area DA. Accordingly, impurities may easily penetrate into the display area DA at the area adjacent to (or closest to) the corner of the display area DA. Therefore, the second pixel 220 having an emission area larger than the emission area of the first pixel 210 is adjacent to the first corner C1 of the display area DA. Accordingly, a test of defects caused by impurities or the like may be quickly and accurately performed using the second pixel 220 as a test pixel.

Figure 4:
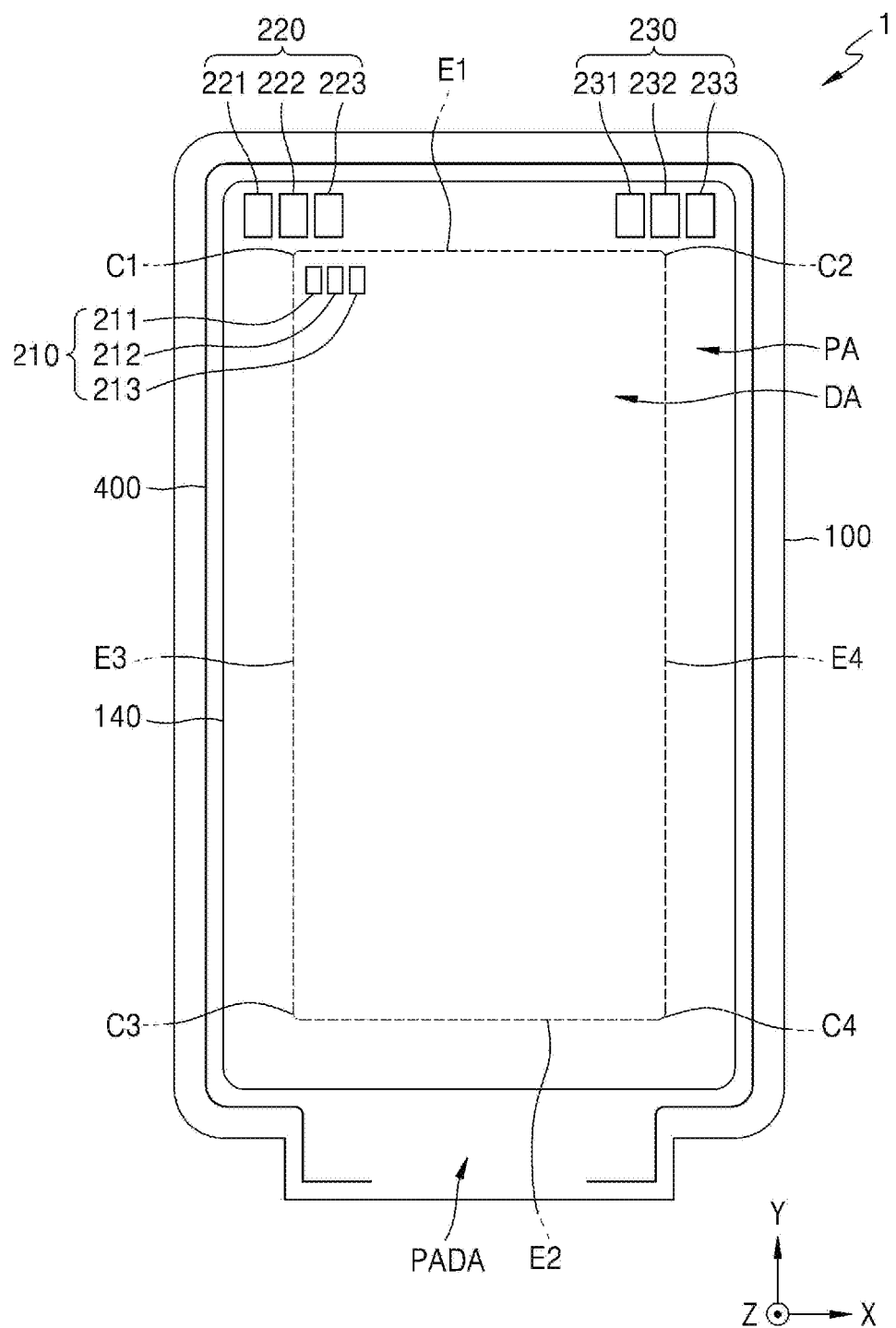
FIG. 4 is a schematic plan view of a position of a third pixel in a display apparatus, according to an embodiment.

It has been described that the second pixel 220, which is a test pixel positioned in the peripheral area PA, is adjacent to the first corner C1 of the display area DA. However, one or more embodiments are not limited thereto. In an embodiment, for example, as illustrated in FIG. 4, which is a schematic plan view of a portion of the display apparatus 1 according to an embodiment, the display apparatus 1 may further include a third pixel 230. The third pixel 230 may be adjacent to the second corner C2 that is different from the first corner C1. The third pixel 230 may be between the display area DA and the dam portion 140 and may have an emission area larger than the emission area of the first pixel 210 included in the display area DA. Since the above description of the second pixel 220 may also be applied to the third pixel 230, a repeated description thereof will not be provided herein. That is, since the emission area of the subpixel having the smallest emission area among the third-first subpixel 231, the third-second subpixel 232, and the third-third subpixel 233 (e.g., a plurality of third subpixels) is larger than the emission area of the subpixel having the largest emission area among the first-first subpixel 211, the first-second subpixel 212, and the first-third subpixel 213, each of the emission areas of the third subpixels is always larger than each of the emission areas of the first subpixels arranged in the display area DA. Accordingly, when the third pixel 230 including the third subpixels is used as a second test pixel, rather than the first pixel 210 including the first subpixels, a test of defects caused by impurities such as moisture or the like may be quickly and accurately performed.

In detail, the second corner C2 may be spaced apart from the pad area PADA positioned in the peripheral area PA by a distance in the first direction (+y direction) and may be spaced apart from the first corner C1 by a distance in a second direction (+x direction) crossing the first direction. That is, the second corner C2 may be a corner positioned at the upper right of the display area DA.

Compared to the third corner C3 and the fourth corner C4 which are positioned in the lower portion of the display area DA, in the first corner C1 and the second corner C2 positioned in the upper portion of the display area DA, impurities may easily penetrate into the display area DA. The second pixel 220 and the third pixel 230 each having an emission area larger than the emission areas of the first pixel 210 are arranged to be respectively adjacent to the first corner C1 and the second corner C2, through which impurities easily penetrate. Accordingly, a test of defects caused by impurities such as moisture or the like may be quickly and accurately performed.

Figure 5:
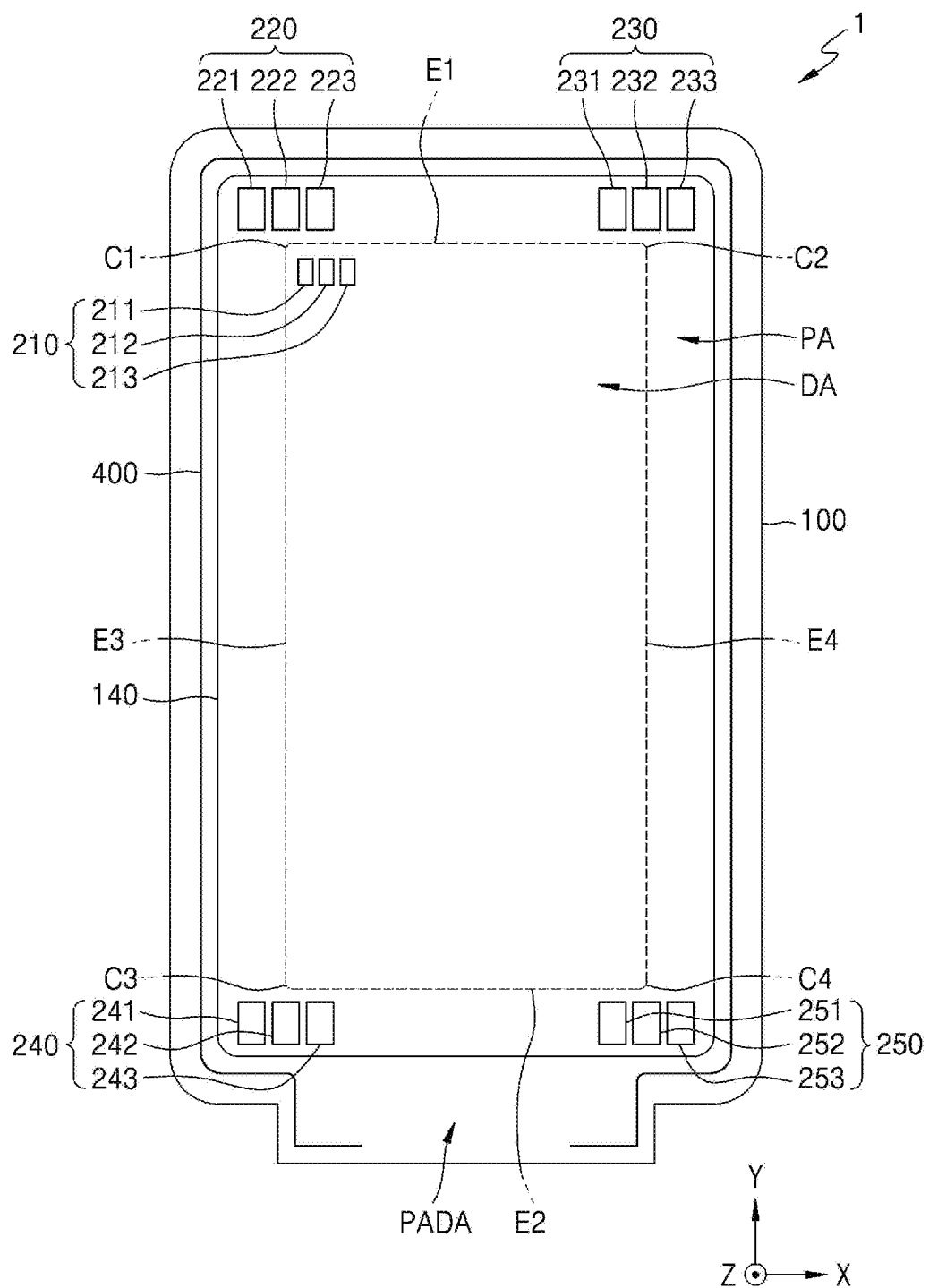
FIG. 5 is a schematic plan view of positions of a fourth pixel and a fifth pixel in a display apparatus, according to an embodiment.

It has been described that the second pixel 220 and the third pixel 230, which are test pixels positioned in the peripheral area PA, are not adjacent to the pad area PADA of the display area DA, but adjacent to an opposite side of the pad area PADA (e.g., are pixels furthest from the pad area PADA). However, one or more embodiments are not limited thereto. In an embodiment, for example, as illustrated in FIG. 5, which is a schematic plan view of a portion of the display apparatus 1 according to an embodiment, the display apparatus 1 may further include a fourth pixel 240 and/or a fifth pixel 250. The fourth pixel 240 may be adjacent to the third corner C3 of the display area DA, which is different from the first corner C1 and the second corner C2, and the fifth pixel 250 may be adjacent to the fourth corner C4 of the display area DA, which is different from the first corner C1, the second corner C2, and the third corner C3. The fourth pixel 240 and the fifth pixel 250 may be between the display area DA and the dam portion 140 and may each have an emission area larger than the emission area of the first pixel 210 included in the display area DA. Since the above description of the second pixel 220 may also be applied to the fourth pixel 240 and the fifth pixel 250, a repeated description thereof will not be provided herein. That is, since the emission area of the subpixel having the smallest emission area among the fourth-first subpixel 241, the fourth-second subpixel 242, and the fourth-third subpixel 243 (e.g., a plurality of fourth subpixels) and the emission area of the subpixel having the smallest emission area among the fifth-first subpixel 251, the fifth-second subpixel 252, and the fifth-third subpixel 253 (e.g., a plurality of fifth subpixels) is larger than the emission area of the subpixel having the largest emission area among the first-first subpixel 211, the first-second subpixel 212, and the first-third subpixel 213, each of the emission areas of the fourth (and fifth) subpixels is always larger than each of the emission areas of the first subpixels arranged in the display area DA. Accordingly, when the fourth pixel 240 (or the fifth pixel 250) including the fourth subpixels (or the fifth subpixels) is used as a third test pixel (or fourth test pixel), rather than the first pixel 210 including the first subpixels, a test of defects caused by impurities such as moisture or the like may be quickly and accurately performed.

In detail, the third corner C3 may be adjacent to the pad area PADA positioned in the peripheral area PA. The fourth corner C4 may be adjacent to the pad area PADA positioned in the peripheral area PA and may be spaced apart from the third corner C3 by a distance in the second direction (+x direction) crossing the first direction. That is, the third corner C3 may be a corner positioned at the lower left of the display area DA, and the fourth corner C4 may be a corner positioned at the lower right of the display area DA.

Compared to the first edge E1 to the fourth edge E4 of the display area DA, even in the third corner C3 and the fourth corner C4 positioned in the lower portion of the display area DA, impurities may easily penetrate into the display area DA. The second pixel 220, the third pixel 230, the fourth pixel 240, and the fifth pixel 250 each having an emission area larger than the emission area of the first pixel 210 are arranged to be respectively adjacent to the first corner C1, the second corner C2, the third corner C3, and the fourth corner C4, through which impurities easily penetrate, and accordingly, a test of defects caused by impurities such as moisture or the like may be quickly and accurately performed.

Figure 6:
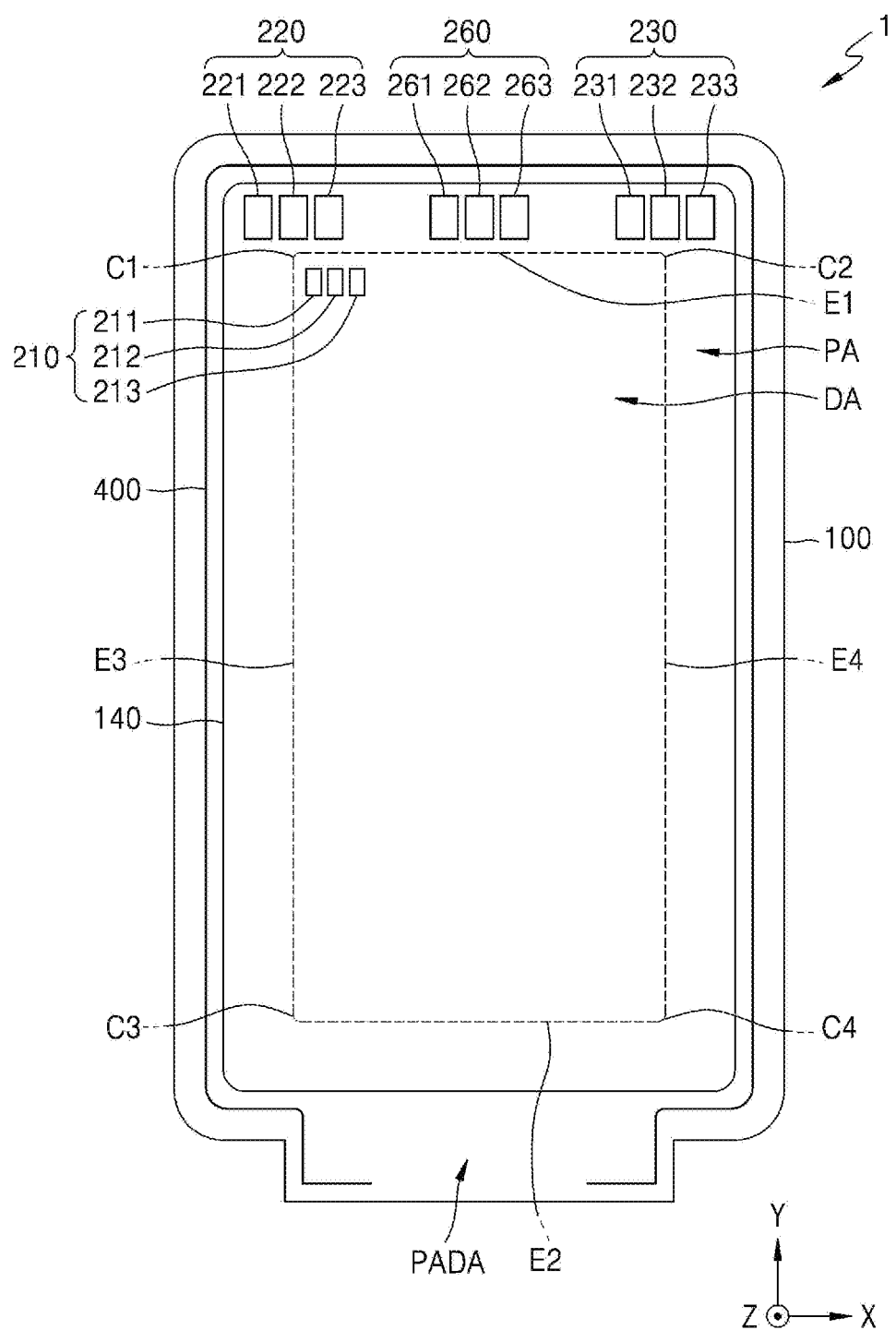
FIG. 6 is a schematic plan view of a position of a sixth pixel in a display apparatus, according to an embodiment.

It has been described that each of the second pixel 220 to the fifth pixel 250, which are test pixels positioned in the peripheral area PA, is adjacent to each of the first corner C1 to the fourth corner C4 of the display area DA. However, one or more embodiments are not limited thereto. In an embodiment, for example, as illustrated in FIG. 6, which is a schematic plan view of a portion of the display apparatus 1 according to an embodiment, the display apparatus 1 may further include a sixth pixel 260 (e.g., a fifth text pixel). The sixth pixel 260 may be adjacent to the first edge E1 of the display area DA between the first corner C1 and the second corner C2. The sixth pixel 260 may be between the display area DA and the dam portion 140 and may have an emission area larger than the emission area of the first pixel 210 included in the display area DA. Since the above description of the second pixel 220 may also be applied to the sixth pixel 260, a repeated description thereof will not be provided herein. That is, since the emission area of the subpixel having the smallest emission area among the sixth-first subpixel 261, the sixth-second subpixel 262, and the sixth-third subpixel 263 (e.g., a plurality of third subpixels) is larger than the emission area of the subpixel having the largest emission area among the first-first subpixel 211, the first-second subpixel 212, and the first-third subpixel 213, each of the emission areas of the third subpixels is always larger than each of the emission areas of the first subpixels arranged in the display area DA. Accordingly, when the sixth pixel 260 including the third subpixels is used as a fifth test pixel, rather than the first pixel 210 including the first subpixels, a test of defects caused by impurities such as moisture or the like may be quickly and accurately performed.

In detail, the first edge E1 may be spaced apart from the pad area PADA positioned in the peripheral area PA by a distance in the first direction (+y direction), may be spaced apart from the first corner C1 by a distance in the second direction (+x direction) crossing the first direction, and may be spaced apart from the second corner C2 by a distance in a third direction (−x direction) crossing the first direction. That is, the first edge E1 may be an edge positioned in the upper portion of the display area DA.

Since the pad area PADA or the like is arranged in the lower portion of the display area DA, impurities may more easily penetrate into the display area DA from the upper portion of the display area DA than from the lower portion of the display area DA. The second pixel 220, the third pixel 230, and the sixth pixel 260 each having an emission area larger than the emission area of the first pixel 210 are arranged to be respectively adjacent to the first corner C1, the second corner C2, and the first edge E1, which are positioned in the upper portion of the display area DA, through which impurities easily penetrate. Accordingly, a test of defects caused by impurities such as moisture or the like may be quickly and accurately performed.

Figure 7:
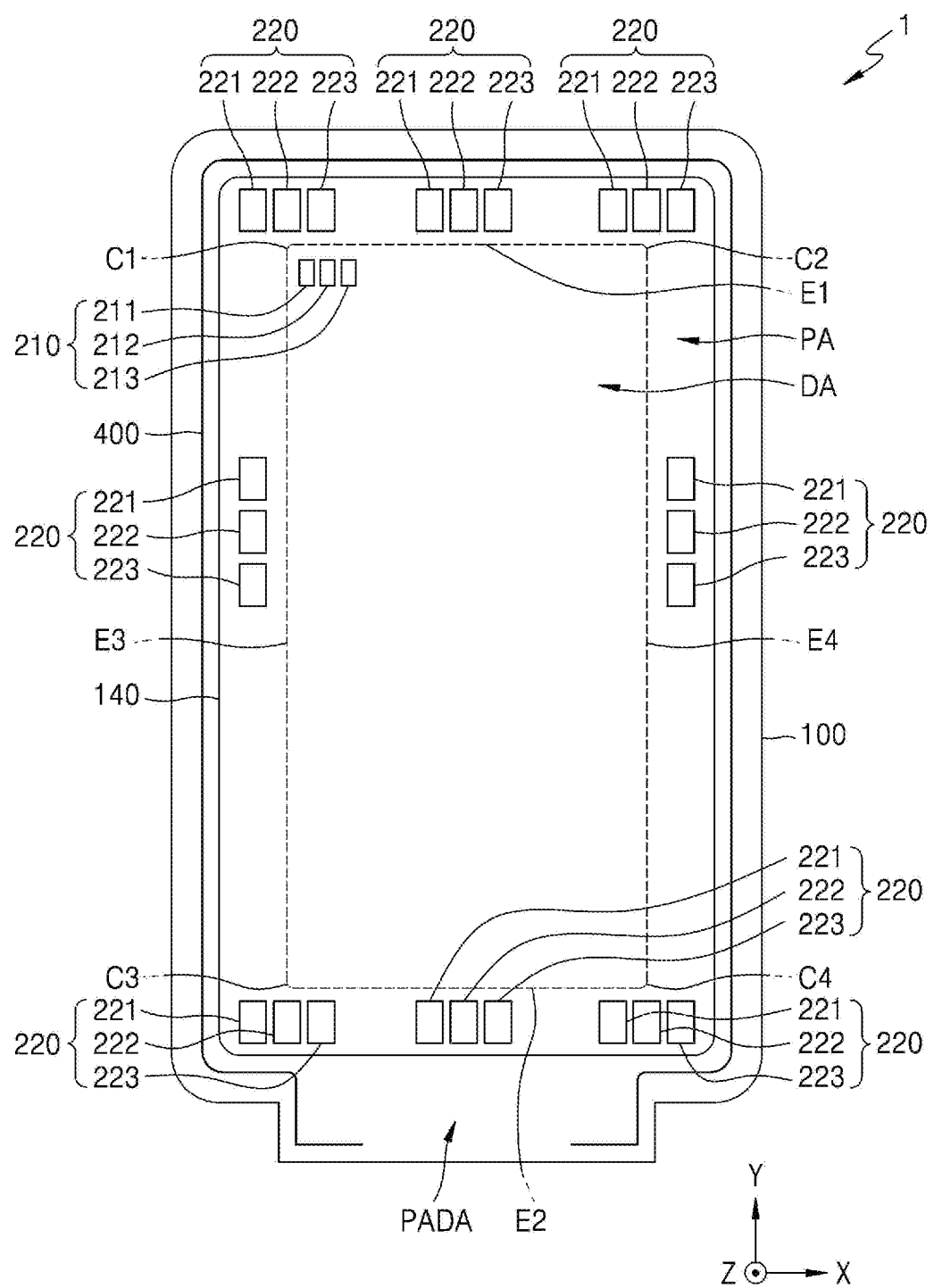
FIG. 7 is a schematic plan view of a position of a second pixel in a display apparatus, according to an embodiment.

It has been described that each of the second pixel 220 to the sixth pixel 260, which are test pixels positioned in the peripheral area PA, is adjacent to each of the first corner C1 to the fourth corner C4 and the first edge E1 of the display area DA. However, one or more embodiments are not limited thereto. In an embodiment, for example, as illustrated in FIG. 7, which is a schematic plan view of a portion of the display apparatus 1 according to an embodiment, a plurality of second pixels 220 may be arranged along the outside of the display area DA to surround the display area DA. Since impurities may penetrate into the display area DA from the entire outer side of the display area DA, the plurality of second pixels 220 are arranged along the edges of the display area DA, and thus, a test of defects caused by impurities such as moisture or the like may be quickly and accurately performed.

Although FIG. 7 illustrates that the plurality of second pixels 220 surround the entire outer side of the display area DA, one or more embodiments are not limited thereto. In an embodiment, for example, except for the second edge E2 through which it is relatively difficult for impurities to penetrate into the display area DA, the plurality of second pixels 220 may be adjacent to the third corner C3, the third edge E3, the first corner C1, the first edge E1, the second corner C2, the fourth edge E4, and the fourth corner C4 of the display area DA.

Figure 8:
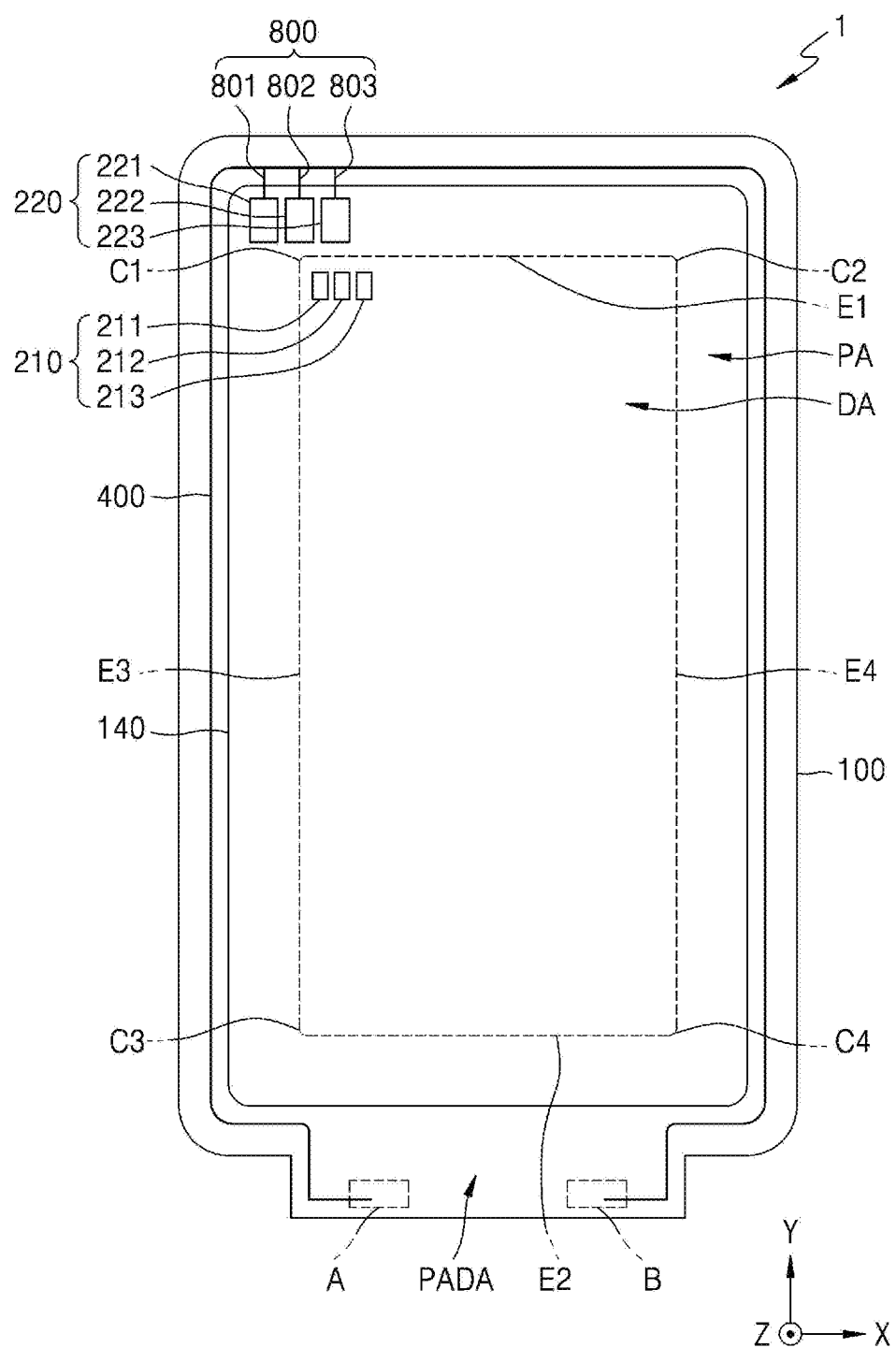
FIG. 8 is a schematic plan view of a display apparatus including a detection wire, according to an embodiment.
Figure 9:
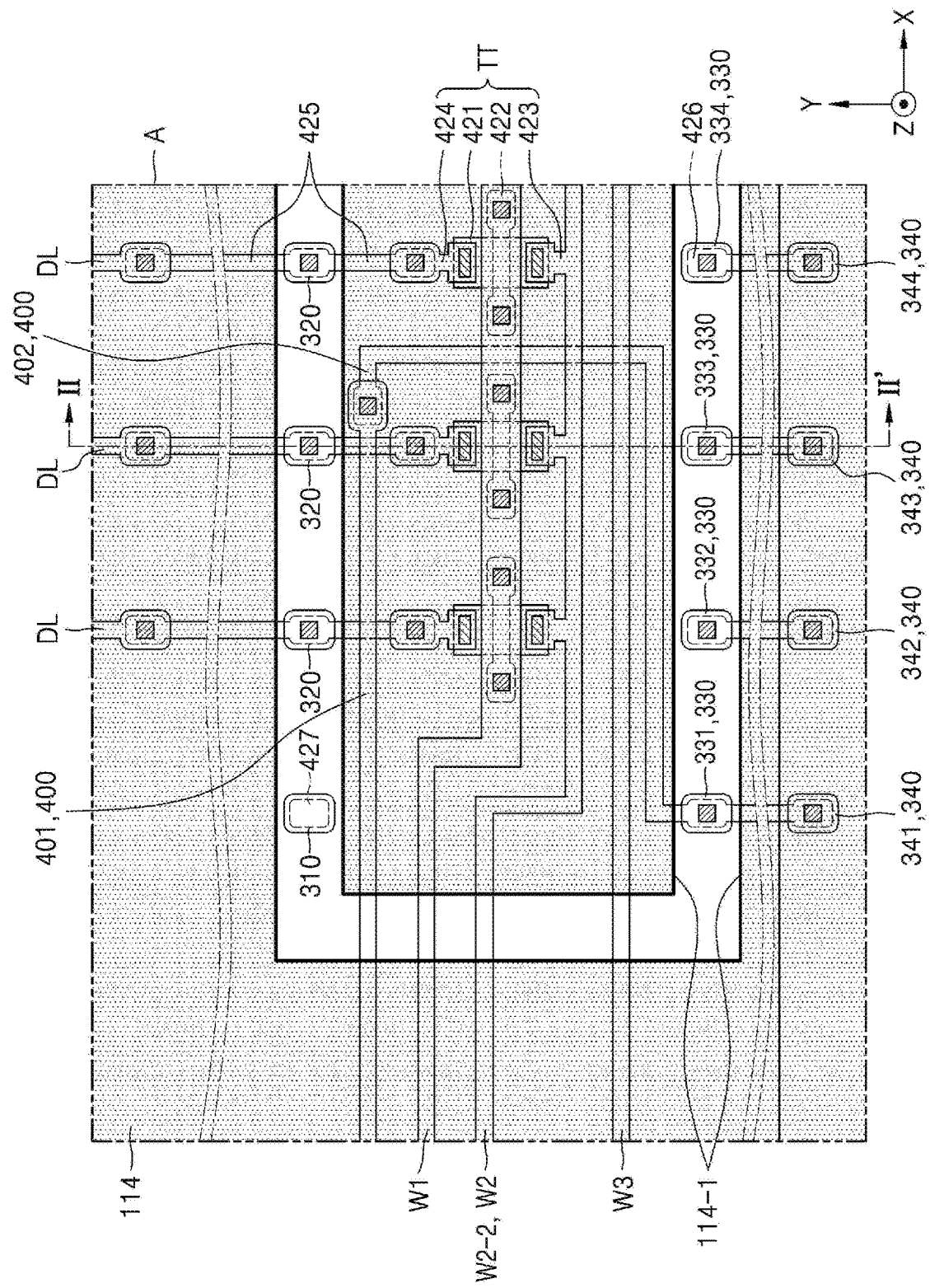
FIG. 9 is a schematic enlarged plan view of a region A of FIG. 8.
Figure 10:
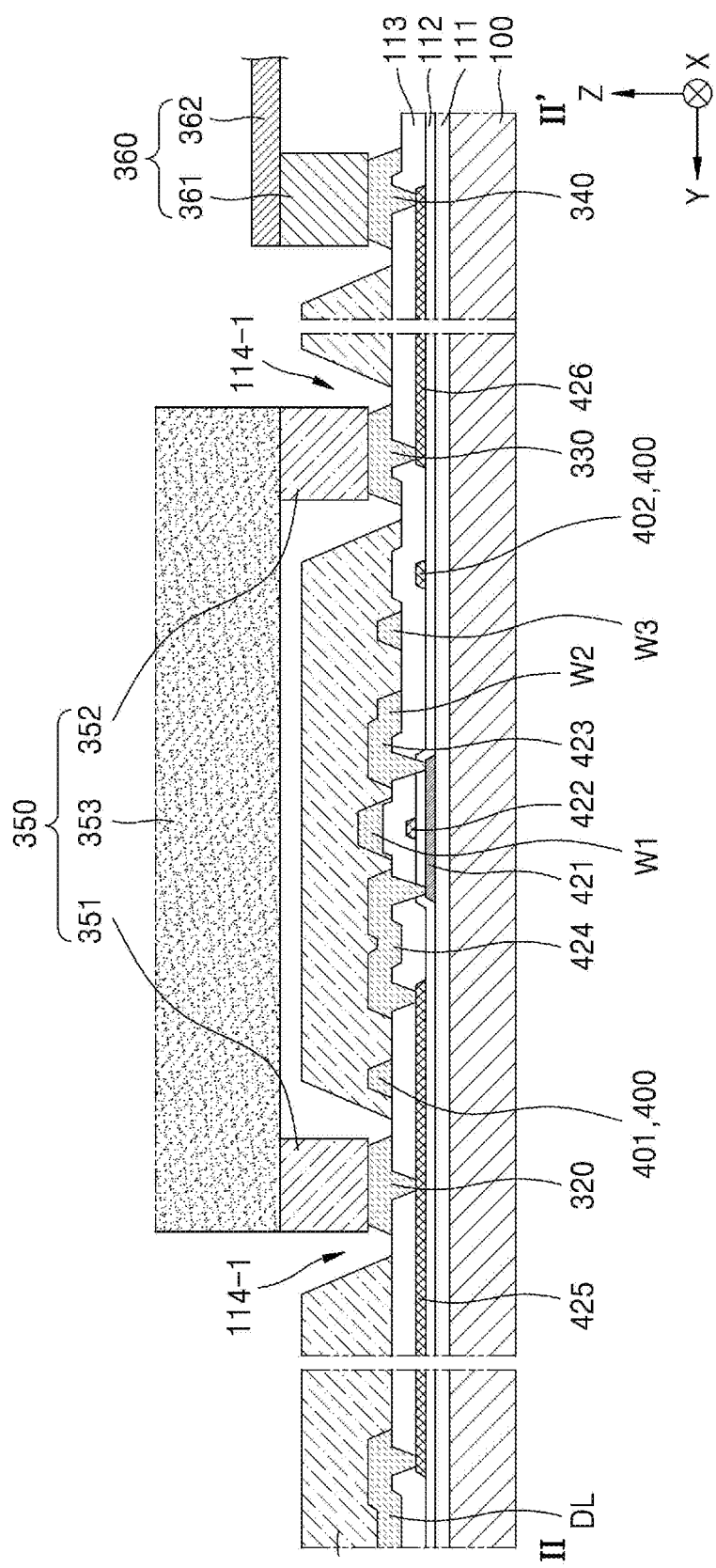
FIG. 10 is a schematic enlarged cross-sectional view of the display apparatus taken along a line II-II' of FIG. 9.

FIG. 8 is a schematic plan view of the display apparatus 1 including a detection wire 400, according to an embodiment, FIG. 9 is a schematic enlarged plan of a region A of FIG. 8, and FIG. 10 is a schematic enlarged cross-sectional view of the display apparatus 1 taken along a line II-II' of FIG. 9.

As illustrated in FIG. 8, the detection wire 400 may be positioned outside the display area DA to surround at least a portion of the display area DA. That is, the detection wire 400 may extend along outer edges of the display area DA to surround the display area DA. As described above, the second pixel 220 may be electrically connected to the detection wire 400, through the first connection wire 800. The first connection wire 800 may include a first-first connection wire 801, a first-second connection wire 802, and a first-third connection wire 803, as a plurality of first connection wires. That is, the second-first subpixel 221 included in the second pixel 220 may be electrically connected to the detection wire 400 through the first-first connection wire 801, the second-second subpixel 222 may be electrically connected to the detection wire 400 through the first-second connection wire 802, and the second-third subpixel 223 may be electrically connected to the detection wire 400 through the first-third connection wire 803. Although FIG. 8 illustrates that the detection wire 400 is electrically connected to one of the second pixel 220, one or more embodiments are not limited thereto. In an embodiment, for example, when there are a plurality of second pixels 220, the detection wire 400 may be electrically connected to each of the second pixels 220.

As illustrated in FIG. 9, the display apparatus 1 according to the present embodiment includes a plurality of test thin-film transistors TT and a plurality of pads 310, 320, 330, and 340, which are positioned in the peripheral area PA, in particular, the pad area PADA.

The test thin-film transistors TT are thin-film transistors for identifying whether pixels of the display area DA normally operate, during a manufacturing process. Each of the plurality of test thin-film transistors TT includes a test semiconductor layer 421, a test gate electrode 422, a test source electrode 423, and a test drain electrode 424 as illustrated in FIGS. 9 and 10. A test thin-film transistor TT may include the same material and be positioned on the same layer as a corresponding one of the semiconductor layer 121, the gate electrode 122, the source electrode 123, and the drain electrode 124 of the thin-film transistor TFT included in the first pixel 210 described above. In an embodiment, for example, in order to secure insulation between the test semiconductor layer 421 and the test gate electrode 422, the first insulating layer 112 may be between the test semiconductor layer 421 and the test gate electrode 422. In addition, the second insulating layer 113 may be arranged on the test gate electrode 422, and the test source electrode 423 and the test drain electrode 424 may be arranged on the second insulating layer 113. As including the same material or as being positioned on the same layer, elements may be formed in a same process from a same material layer, elements may be in a same layer as each other as respective portions of a same material layer, may be on a same layer by forming an interface with a same underlying or overlying layer, etc., without being limited thereto.

For reference, in FIG. 9, only a positional relationship between the test semiconductor layer 421, the test gate electrode 422, the test source electrode 423, and the test drain electrode 424 is illustrated by omitting the first insulating layer 112 and the second insulating layer 113 for convenience. In FIG. 9, other various wires and pads are also illustrated. The buffer layer 111 may be between the test thin-film transistor TT and the substrate 100.

The test gate electrodes 422 of the plurality of test thin-film transistors TT are electrically connected to each other, and a first wire W1 as a bridge wire makes this connection possible. That is, the first wire W1 arranged on a layer different from a layer on which the test gate electrodes 422 are arranged is configured to electrically connect, to each other, the test gate electrodes 422 spaced apart from each other. In an embodiment, for example, the first wire W1 may be positioned on the second insulating layer 113 and may be configured to electrically connect, to each other, the test gate electrodes 422 spaced apart from each other, by directly contacting the test gate electrodes 422 through (or at) contact holes formed in the second insulating layer 113 between the first wire W1 and the test gate electrodes 422. Accordingly, at least a portion of the first wire W1 and the test gate electrodes 422 may be positioned on a virtual straight line (extending in an x-axis) as illustrated in FIG. 9.

Each of the test thin-film transistors TT includes a test source electrode 423 and a test drain electrode 424. The first wire W1 may include the same material as the test source electrode 423 and the test drain electrode 424, for example, a metal such as titanium, copper, or aluminum, and may have a single-layered or multi-layered structure. When the first wire W1 has a multi-layered structure, the first wire W1 may have a three-layered structure of titanium/aluminum/titanium. Furthermore, the first wire W1 may be arranged on the same layer as the test source electrode 423 and the test drain electrode 424, that is, on the second insulating layer 113. Accordingly, the first wire W1 may be connected to the test gate electrodes 422 thereunder, through a contact hole formed in the second insulating layer 113.

A plurality of data lines DL cross the display area DA and extend from the display area DA to the peripheral area PA. Each of the plurality of test thin-film transistors TT is electrically connected to a corresponding one of the plurality of data lines DL. Accordingly, when an electrical signal is simultaneously applied to the test gate electrodes 422 of the plurality of test thin-film transistors TT, the test gate electrodes 422 being electrically connected to each other, a channel is simultaneously formed in the test semiconductor layers 421 of the plurality of test thin-film transistors TT. As described above, when the plurality of test thin-film transistors TT are simultaneously turned on, an electrical signal from a second wire W2, which is a test signal line, is transmitted to the plurality of data lines DL. Accordingly, pixels of the display area DA electrically connected to the plurality of data lines DL emit light so that testing of whether the pixels in the display area DA are defective is possible.

When the display apparatus 1 is manufactured and then operated as a finished device, the test thin-film transistors TT are turned off. In an embodiment, for example, when the test thin-film transistors TT are P-type thin-film transistors, a VGH bias voltage (positive bias voltage) is applied to the first wire W1 to turn off the test thin-film transistors TT. The test thin-film transistors TT may be off during a display operation of the display apparatus 1. Accordingly, a signal from a driving chip 350 to be described below may be applied to the data lines DL through first pads 320.

The test gate electrodes 422 may include, for example, a metal such as molybdenum or aluminum and may have a single-layered or multi-layered structure. When the test gate electrodes 422 have a multi-layered structure, the test gate electrodes 422 may have a three-layered structure of molybdenum/aluminum/molybdenum. The test gate electrodes 422 may be between the first insulating layer 112 and the second insulating layer 113 as described above. Accordingly, the test gate electrodes 422 are positioned under the second insulating layer 113.

As described above, the plurality of data lines DL cross the display area DA and extend therefrom to the peripheral area PA. The plurality of data lines DL may include the same material as a test source electrode 423 and a test drain electrode 424 of the test thin-film transistor TT, for example, a metal such as titanium, copper, or aluminum, and may have a single-layered or multi-layered structure. When the plurality of data lines DL have a multi-layered structure, the plurality of data lines DL may have a three-layered structure of titanium/aluminum/titanium. Furthermore, the plurality of data lines DL may be arranged on the same layer as a layer on which the test source electrode 423 and the test drain electrode 424 are arranged. Each of the plurality of test thin-film transistors TT is electrically connected to a corresponding one of the plurality of data lines DL as described above, via intermediate wires 425. That is, the intermediate wires 425 are configured to connect the plurality of data lines DL of the display area DA, to the plurality of test thin-film transistors TT of the pad area PADA.

The intermediate wires 425 may include the same material as the test gate electrodes 422, for example, a metal such as molybdenum or aluminum, and may have a single-layered or multi-layered structure. When the intermediate wires 425 have a multi-layered structure, the intermediate wires 425 may have a three-layered structure of molybdenum/aluminum/molybdenum. Furthermore, the intermediate wires 425 may be arranged on the same layer as a layer on which the test gate electrodes 422 are arranged. An end (e.g., a first end) of an intermediate wire 425 which is closest to a data line DL, is connected to the data line DL thereon through a contact hole formed in the second insulating layer 113, and an end (e.g., a second end opposite to the first end) of the intermediate wire 425 which is closest to the test thin-film transistor TT, is connected to a test drain electrode 424 thereon through a contact hole formed in the second insulating layer 113. Moreover, the test source electrodes 423 of the test thin-film transistors TT are connected to a second-second wire W2-2 (including a portion extending in the x-axis direction), which is a portion of the second wire W2 serving as a test signal line. In detail, the test source electrodes 423 may be integrated with the second-second wire W2-2.

As illustrated in FIGS. 9 and 10, the display apparatus 1 may include a plurality of first pads 310, 320, and 330.

Among the plurality of first pads 310, 320, and 330, each of the first pads 320 positioned in a direction (+y direction) of the display area DA with respect to the plurality of test thin-film transistors TT may be positioned over a corresponding one of the intermediate wires 425 and may contact the corresponding one of the intermediate wires 425. Each of the plurality of first pads 310, 320, and 330 may include the same material as the test source electrode 423 and the test drain electrode 424 of the test thin-film transistor TT, for example, a metal such as titanium, copper, or aluminum, and may have a single-layered or multi-layered structure. When the plurality of first pads 310, 320, and 330 have a multi-layered structure, the plurality of first pads 310, 320, and 330 may have a three-layered structure of titanium/aluminum/titanium. Furthermore, the plurality of first pads 310, 320, and 330 may be arranged on the same layer as a layer on which the test source electrode 423 and the test drain electrode 424 are arranged. Accordingly, the plurality of first pads 310, 320, and 330 may be connected to an intermediate wire 425 through a contact hole formed in the second insulating layer 113.

A first pad 310 among the plurality of first pads 310, 320, and 330 may be a dummy pad that is not connected to other electrical elements formed on the substrate 100 (e.g., electrically floating). In this case, it is necessary to make a height from the bottom surface of the substrate 100 to the top surfaces of the first pads 320 electrically connected to the data line DL, be substantially the same as a height from the bottom surface of the substrate 100 to the top surface of the first pad 310 serving as a dummy pad. To this end, since the intermediate wires 425 are positioned under the first pads 320 electrically connected to the data line DL, a step difference regulator 427 may be positioned under the first pad 310 serving as a dummy pad, in a direction of the substrate 100 (e.g., between the dummy pad and the substrate 100). The step difference regulator 427 may include the same material as the intermediate wires 425, that is, the same material as the test gate electrodes 422, for example, a metal such as molybdenum or aluminum, and may have the same layered structure as the intermediate wires 425.

The first pads 320 among the plurality of first pads 310, 320, and 330 are positioned in the direction (+y direction) of the display area DA with respect to the plurality of test thin-film transistors TT, and first pads 330 among the first pads 310, 320, and 330 are positioned in an opposite direction (−y direction) to the direction of the display area DA with respect to the plurality of test thin-film transistors TT. That is, first pads 330 are further from the display area DA than the first pads 320. As illustrated in FIG. 10, the first pads 320 and the first pads 330 may be connected to the driving chip 350 included in the display apparatus 1, through an anisotropic conductive film (not illustrated for convenience).

The plurality of first pads 310, 320, and 330 are positioned on the second insulating layer 113 covering the peripheral area PA as described above. In addition, the planarization layer 114 is positioned on the second insulating layer 113 in the peripheral area PA. The second insulating layer 113 and the planarization layer 114 may also be present in the display area DA as illustrated in FIG. 2. The planarization layer 114 may include an organic material such as acryl, BCB, or HMDSO. The planarization layer 114 includes (or defines) a first opening 114-1 that exposes the plurality of first pads 310, 320, and 330 to outside the planarization layer 114.

The driving chip 350 includes a body 353, and output terminals 351 (e.g., second output terminals) and input terminals 352 positioned on both of opposing sides of the body 353. FIG. 10 is a cross-sectional view only illustrating one output terminal 351 and one input terminal 352 of the driving chip 350, but the driving chip 350 may include a plurality of output terminals 351 and a plurality of input terminals 352 (respectively arranged in the x-axis direction). The driving chip 350 may be, for example, an integrated circuit (IC) chip or the like.

The first pads 330 (e.g., output pads) exposed by the first opening 114-1 of the planarization layer 114 are connected to the input terminals 352 of the driving chip 350, and the first pads 320 (e.g., input pads) are connected to the output terminals 351 of the driving chip 350. Accordingly, when the display apparatus 1 is driven as a finished electronic device, and not driven for testing, an electrical signal from the driving chip 350 may be transmitted from the output terminals 351 of the driving chip 350 to the data lines DL, via the first pads 320 and the intermediate wires 425, and as a result, may be transmitted to a plurality of pixels in the display area DA.

Information about an image to be implemented in the display area DA may be input to the driving chip 350 through the input terminals 352 of the driving chip 350, from outside the display apparatus 1. To this end, an electronic device including the display apparatus 1, may include a printed circuit board 360 including a plate 362 and output terminals 361 (e.g., first output terminals). FIG. 10 is a cross-sectional view only illustrating one of the output terminal 361 of the printed circuit board 360, but the printed circuit board 360 may include a plurality of output terminals 361 (arranged in the x-axis direction).

The display apparatus 1 includes second pads 340 positioned in an opposite direction (−y direction) to the direction of the display area DA, with respect to a first pad 330. Each of the second pads 340 may include the same material as the test source electrode 423 and the test drain electrode 424 of the test thin-film transistor TT, for example, a metal such as titanium, copper, or aluminum, and may have a single-layered or multi-layered structure. When the second pads 340 have a multi-layered structure, the second pads 340 may have a three-layered structure of titanium/aluminum/titanium. Furthermore, the second pads 340 may be arranged on the same layer as a layer on which the test source electrode 423 and the test drain electrode 424 are arranged. That is, the second pads 340 may be positioned on the second insulating layer 113.

The second pads 340 may be electrically connected to corresponding first pads 330, by second connection wires 426. The second connection wires 426 may include the same material as the test gate electrodes 422, for example, a metal such as molybdenum or aluminum, and may have a single-layered or multi-layered structure. When the second connection wires 426 have a multi-layered structure, the second connection wires 426 may have a three-layered structure of molybdenum/aluminum/molybdenum. Furthermore, the second connection wires 426 may be arranged on the same layer as a layer on which the test gate electrodes 422 are arranged. That is, the second connection wires 426 may be between the first insulating layer 112 and the second insulating layer 113. An end of a second connection wire 426 in the direction of the display area DA (e.g., a first end closest to the display area DA) is connected to a first pad 330 thereon, through a contact hole formed in the second insulating layer 113, and the other end of the second connection wire 426 (e.g., a second end opposite to the first end) is connected to a second pad 340 thereon, through a contact hole formed in the second insulating layer 113.

As described above, information about an image to be implemented in the display area DA, may be input to the driving chip 350 through the input terminals 352 of the driving chip 350. To this end, the output terminals 361 of the printed circuit board 360 are electrically connected to the second pads 340 such as through an anisotropic conductive film (not illustrated), the second pads 340 are electrically connected to the first pads 330 by the second connection wires 426, and the first pads 330 are electrically connected to the input terminals 352 of the driving chip 350.

Moreover, since the input terminals 352 of the driving chip 350 are connected to the first pads 330 through an anisotropic conductive film or the like, and the output terminals 351 of the driving chip 350 are connected to the first pads 320 through an anisotropic conductive film or the like, the driving chip 350 is positioned over the test thin-film transistors TT as illustrated in FIG. 10 (e.g., further from the substrate 100 than the test thin-film transistors TT). In this process, the first pad 310, which is a dummy pad that is not connected to other electrical elements formed on the substrate 100, is also connected to the input terminal 352 of the driving chip 350 through an anisotropic conductive film or the like.

As described above, since the step difference regulator 427 is positioned under the first pad 310 serving as a dummy pad in the direction of the substrate 100, the height from the bottom surface of the substrate 100 to the top surfaces of the first pads 320 electrically connected to the data line DL is substantially similar to or the same as the height from the bottom surface of the substrate 100 to the top surface of the first pad 310. Accordingly, the driving chip 350 may be stably positioned over the first pads 310, 320, and 330.

As illustrated in FIG. 9, the detection wire 400 includes a first detection wire 401 (e.g., a first wire portion) and a second detection wire 402 (e.g., a second wire portion). When viewed in a direction (z-axis direction) perpendicular to the substrate 100, the first detection wire 401 is positioned to cross the first opening 114-1 of the planarization layer 114 in the peripheral area PA of the substrate 100. The first detection wire 401 is positioned between the second insulating layer 113 and the planarization layer 114, and in particular, the first detection wire 401 may be positioned on the second insulating layer 113. The first detection wire 401 may include the same material as the first pads 310, 320, and 330, the test source electrode 423, and the test drain electrode 424, for example, a metal such as titanium, copper, or aluminum, and may have the same layered structure as the first pads 310, 320, and 330, the test source electrode 423, and the test drain electrode 424. That is, the first detection wire 401 may have a single-layered or multi-layered structure. When the first detection wire 401 has a multi-layered structure, the first detection wire 401 may have a three-layered structure of titanium/aluminum/titanium.

The first detection wire 401 may be connected to a second detection wire 402 thereunder through a contact hole formed in the second insulating layer 113. The second detection wire 402 is positioned under the second insulating layer 113, and in particular, the second detection wire 402 may be positioned on the first insulating layer 112. Accordingly, the second detection wire 402 may include the same material as the test gate electrodes 422, for example, a metal such as molybdenum or aluminum, and may have the same layered structure as the test gate electrodes 422. That is, the second detection wire 402 may have a single-layered or multi-layered structure. When the second detection wire 402 have a multi-layered structure, the second detection wire 402 may have a three-layered structure of molybdenum/aluminum/ molybdenum. Furthermore, the second detection wire 402 may be arranged on the same layer as a layer on which the test gate electrodes 422 are arranged.

The second detection wire 402 may be connected to a first pad 331 that is one of the first pads 330. That is, the second detection wire 402 may extend to the lower portion of the first pad 331 and be connected to the first pad 331 thereon through a contact hole formed in the second insulating layer 113. Also, the first pad 331 may be connected to a second pad 341 that is one of the second pads 340, through the second connection wire 426.

For reference, FIG. 9 illustrates that a first pad 332, a first pad 333, and a first pad 334 among the first pads 330 are not connected to other wires in the direction (+y direction) of the display area DA. However, this is illustrated as such for convenience, and the first pad 332, the first pad 333, or the first pad 334 may be connected to another wire. The other wire may be a wire between the first insulating layer 112 and the second insulating layer 113 or may be a wire positioned on the second insulating layer 113. This applies to the following embodiments and modifications thereof.

As illustrated in FIG. 9, the display apparatus 1 according to the present embodiment may include the first wire W1. When viewed in the direction (z-axis direction) perpendicular to the substrate 100, the first wire W1 may be positioned to cross the first opening 114-1 of the planarization layer 114 in the peripheral area PA of the substrate 100. Also, as illustrated in FIG. 9, the first detection wire 401 may include a portion parallel to and adjacent to at least a portion of the first wire W1.

The first wire W1 is a bridge wire as described above and is configured to electrically connect, to each other, the test gate electrodes 422 spaced apart from each other. The first wire W1 may be configured to electrically connect, to each other, the test gate electrodes 422 spaced apart from each other by directly contacting the test gate electrodes 422 through contact holes formed in the second insulating layer 113 between the first wire W1 and the test gate electrodes 422.

Moreover, as described above, the display apparatus 1 according to the present embodiment may include the second wire W2 serving as a test signal line. When viewed in the direction (z-axis direction) perpendicular to the substrate 100, the second wire W2 may be positioned to cross the first opening 114-1 of the planarization layer 114 in the peripheral area PA of the substrate 100. Also, as illustrated in FIG. 9, the second wire W2 may include a portion parallel to and adjacent to at least a portion of the first wire W1.

The second wire W2 serving as a test signal line is connected to the test source electrodes 423 of the test thin-film transistors TT, and in particular, the second wire W2 may be formed as one body with the test source electrodes 423. That is, the second wire W2 is between the second insulating layer 113 and the planarization layer 114, and in particular, the second wire W2 may be positioned on the second insulating layer 113. The second wire W2 may include the same material as the first pads 310, 320, and 330, the test source electrode 423, and the test drain electrode 424, for example, a metal such as titanium, copper, or aluminum, and may have the same layered structure as the first pads 310, 320, and 330, the test source electrode 423, and test the drain electrode 424. That is, the second wire W2 may have a single-layered or multi-layered structure. When the second wire W2 has a multi-layered structure, the second wire W2 may have a three-layered structure of titanium/aluminum/titanium.

As described above, the test thin-film transistors TT are test thin-film transistors for identifying whether pixels of the display area DA normally operate, during a manufacturing process. The first wire W1 and the second wire W2 are electrically connected to the plurality of test thin-film transistors TT and are wires for applying a test signal to the data lines DL (e.g., a first test signal wire and a second test signal wire). That is, a test gate signal may be applied to the plurality of test thin-film transistors TT through the first wire W1 (e.g., the first test signal wire), and a test data signal may be transmitted to the plurality of data lines DL electrically connected to the test thin-film transistors TT, through the second wire W2 (e.g., the second test signal wire).

Moreover, as illustrated in FIG. 9, the display apparatus 1 according to the present embodiment may include a third wire W3. When viewed in the direction (z-axis direction) perpendicular to the substrate 100, the third wire W3 may be positioned to cross the first opening 114-1 of the planarization layer 114 in the peripheral area PA of the substrate 100. Also, as illustrated in FIG. 9, the third wire W3 may include a portion parallel to and adjacent to at least a portion of the second wire W2.

The third wire W3 is between the second insulating layer 113 and the planarization layer 114, and in particular, the third wire W3 may be positioned on the second insulating layer 113. The third wire W3 may include the same material as the first detection wire 401, for example, a metal such as titanium, copper, or aluminum, and may have the same layered structure as the first detection wire 401. That is, the third wire W3 may have a single-layered or multi-layered structure. When the third wire W3 has a multi-layered structure, the third wire W3 may have a three-layered structure of titanium/aluminum/titanium.

Similar to the second wire W2, the third wire W3 may be a wire that is electrically connected to the test source electrodes 423 of the test thin-film transistors TT to which the second wire W2 is not connected, in a portion not illustrated in FIG. 9, and applies a test signal to the data lines DL electrically connected to the test thin-film transistors TT.

FIG. 9 is a schematic diagram of a region A of FIG. 8, and a region B of FIG. 8 has a shape in which the left and right sides of FIG. 9 are inverted.

The detection wire 400 may be used to identify whether a crack has occurred in the display panel. One end of the detection wire 400 surrounding the display area DA is electrically connected to the first pad 331 in the region A (e.g., first test pad), and the other end of the detection wire 400 is electrically connected to the first pad 331 in the region B (e.g., second test pad). Accordingly, a voltage and/or electrical current may be measured by applying an electrical signal between the first pad 331 in the region A and a pad corresponding to the first pad 331 in the region B, thereby identifying whether a crack has occurred in a structure of the display apparatus 1, such as in the display panel thereof. In an embodiment, when a crack has occurred on the edge of the display panel during a manufacturing process (such as at a corner of the display panel), the display panel is disconnected by the crack, and accordingly, an electrical signal detected between the first pad 330 in the region A and the corresponding pad in the region B is different from an electrical signal in a normal case (e.g., operation of a final display panel). After the display apparatus 1 is manufactured, an electrical signal such as a DC bias voltage is applied to the detection wire 400 from a power supply of the display apparatus 1. Then, whether a crack has occurred in a structure of the display apparatus 1 is identified by measuring a voltage applied actually to the detection wire 400.

In the case of the display apparatus 1 according to an embodiment, the detection wire 400 is electrically connected to the second pixel 220 through the first connection wire 800. In detail, the detection wire 400 is electrically connected to the second pixel electrode 161 through the first connection wire 800. Accordingly, an electrical signal may be applied to the second pixel 220 through the detection wire 400. In an embodiment, for example, an electrical signal may be applied to the detection wire 400 by applying an electrical signal between the first pad 331 in the region A electrically connected to the detection wire 400 and the pad corresponding to the first pad 331 in the region B. When there are a plurality of second pixels 220, the detection wire 400 is electrically connected to each of the second pixels 220. In this case, the detection wire 400 may be electrically connected to the second pixel electrode 161 of each of the second pixels 220.

The detection wire 400 is positioned outside the display area DA and is not connected to the first pixel 210 included in the display area DA. Accordingly, when an electrical signal is applied to the second pixel 220 through the detection wire 400, the electrical signal may be applied to the second pixel 220 independently of the first pixel 210. In addition, after the display apparatus 1 is tested, the second pixel 220 does not emit light so that the second pixel 220 may not emit light when an image is to be implemented in the display area DA. That is, the second pixel 220 (and other test pixels) may be in a non-display area of the display apparatus 1. The non-display area may include or correspond to the peripheral area PA, without being limited thereto.

Figure 11:
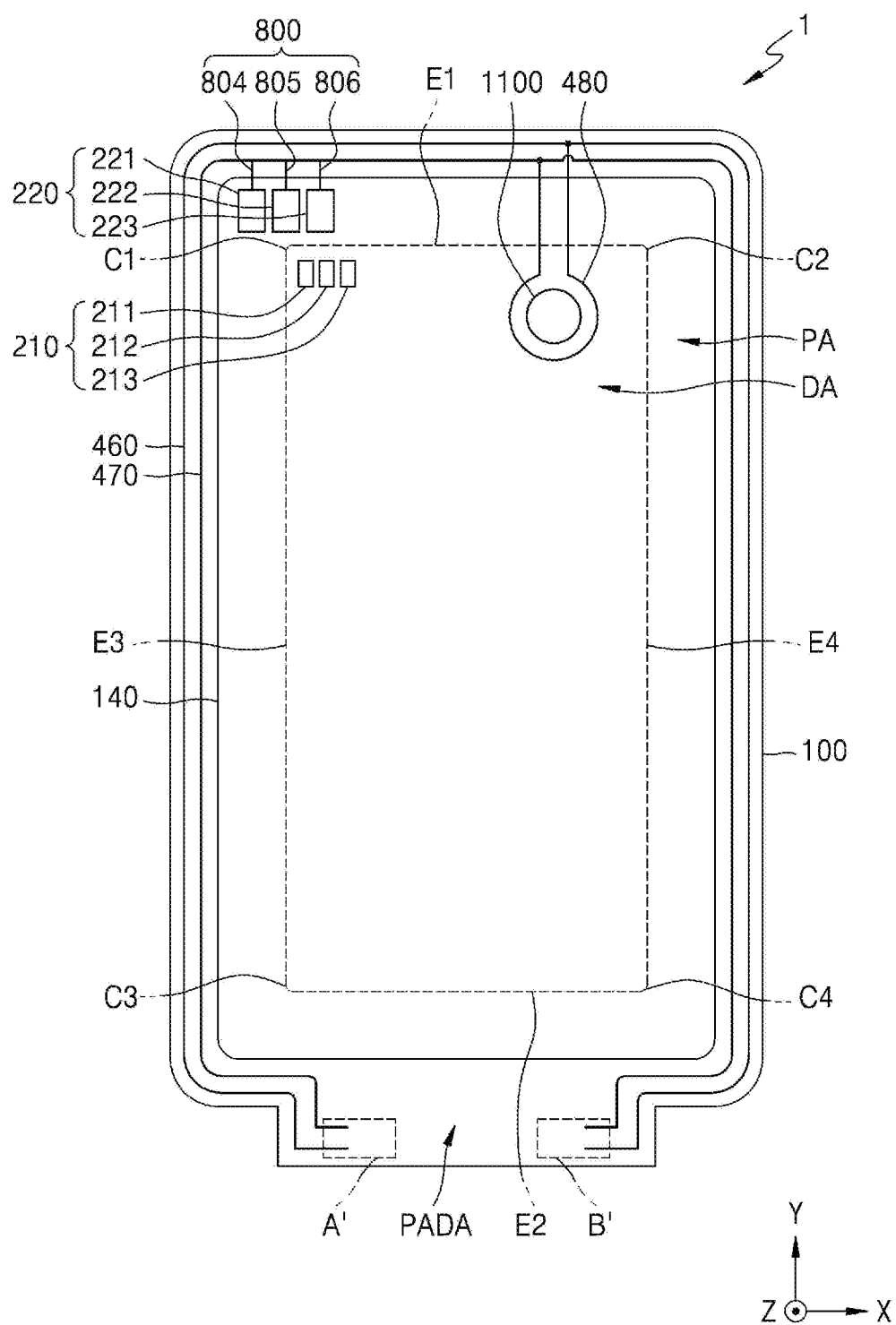
FIG. 11 is a schematic plan view of a display apparatus including a detection wire, according to an embodiment.
Figure 12:
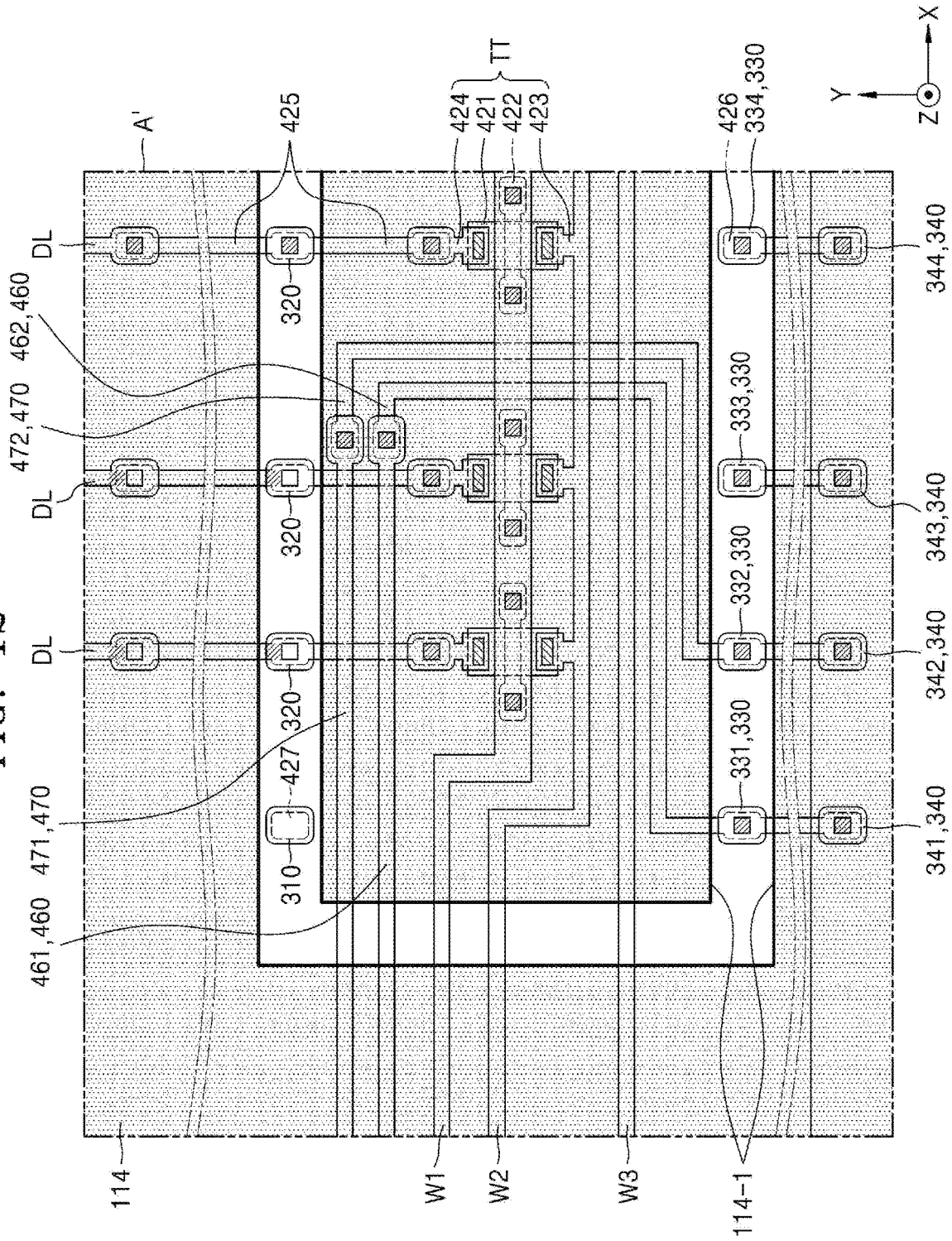
FIG. 12 is a schematic enlarged plan view of a region A' of FIG. 11.

FIG. 11 is a schematic plan view of the display apparatus 1 including a detection wire 400, according to an embodiment, and FIG. 12 is a schematic enlarged plan view of a region A' of FIG. 11.

As illustrated in FIG. 11, the substrate 100 may include a through hole 1100. The through hole 1100 may be positioned inside the display area DA. However, since pixels are not formed in and around an area where the through hole 1100 is positioned, the through hole 1100 may not be able to display an image.

The detection wire 400 may include a first peripheral detection wire 460, a second peripheral detection wire 470, and a through hole detection wire 480 (e.g., through hole detection wire portion). The first peripheral detection wire 460 and the second peripheral detection wire 470 may be positioned outside the display area DA to surround at least a portion of the display area DA, and the through hole detection wire 480 may be arranged so that at least a portion of the through hole detection wire 480 is adjacent to the through hole 1100. The first peripheral detection wire 460 may be electrically connected to the through hole detection wire 480, and the through hole detection wire 480 may be electrically connected to the second peripheral detection wire 470.

As described above, the second pixel 220 may be electrically connected to the detection wire 400 through the first connection wire 800. The first connection wire 800 may include a first-fourth connection wire 804, a first-fifth connection wire 805, and a first-sixth connection wire 806. That is, the second-first subpixel 221 included in the second pixel 220 may be electrically connected to the detection wire 400 through the first-fourth connection wire 804, the second-second subpixel 222 may be electrically connected to the detection wire 400 through the first-fifth connection wire 805, and the second-third subpixel 223 may be electrically connected to the detection wire 400 through the first-sixth connection wire 806.

As illustrated in FIG. 12, the display apparatus 1 according to the present embodiment is different from the display apparatus 1 according to the embodiment described above with reference to FIG. 8 or the like, in the structure of the detection wire 400.

The first wire W1, the second wire W2, and the third wire W3 have the same structure as the first wire W1, the second wire W2, and the third wire W3 in the display apparatus 1 according to the embodiment described with reference to FIG. 8 or the like. However, the detection wire 400 of the display apparatus 1 according to the present embodiment includes the first peripheral detection wire 460 and the second peripheral detection wire 470. Accordingly, the first peripheral detection wire 460 may include a first-first peripheral detection wire 461 and a first-second peripheral detection wire 462, and the second peripheral detection wire 470 may include a second-first peripheral detection wire 471 and a second-second peripheral detection wire 472. In addition, the first-second peripheral detection wire 462 may be connected to the first pad 331, which is one of the first pads 330, and the second-second peripheral detection wire 472 may be connected to the first pad 332, which is one of the first pads 330.

FIG. 12 is a schematic diagram of a region A' of FIG. 11, and a region B' of FIG. 11 has a shape in which the left and right sides of FIG. 12 are inverted.

The through hole detection wire 480 included in the detection wire 400 may be used to identify whether a crack has occurred around the through hole 1100. One end of the through hole detection wire 480 adjacent to the through hole 1100 is electrically connected to the first peripheral detection wire 460 surrounding the display area DA. One end of the first peripheral detection wire 460 is electrically connected to the first pad 331 in the region A', and the other end of the first peripheral detection wire 460 is electrically connected to a pad corresponding to the first pad 331 in the region B'. The other end of the through hole detection wire 480 is electrically connected to the second peripheral detection wire 470 surrounding the display area DA. One end of the second peripheral detection wire 470 is electrically connected to the first pad 332 in the region A', and the other end of the second peripheral detection wire 470 is electrically connected to a pad corresponding to the first pad 332 in the region B'.

Accordingly, a voltage and/or current may be measured by applying an electrical signal between the first pad 331 in the region A' or the pad corresponding to the first pad 331 in the region B', and the first pad 332 in the region A' and the pad corresponding to the first pad 332 in the region B', thereby identifying whether a crack has occurred around the through hole 1100. This is since, when a crack has occurred around the through hole 1100 during a manufacturing process, the through hole detection wire 480 is disconnected by the crack, and accordingly, an electrical signal detected between the first pad 331 in the region A' or the pad corresponding to the first pad 331 in the region B' and the first pad 332 in the region A' and the pad corresponding to the first pad 332 in the region B' is different from an electrical signal in a normal case. After the display apparatus is manufactured, a DC bias voltage is applied to the detection wire 400 from a power supply of the display apparatus 1.

In the case of the display apparatus 1 according to an embodiment, the detection wire 400 is electrically connected to the second pixel 220 through the first connection wire 800. In detail, the detection wire 400 is electrically connected to the second pixel electrode 161 through the first connection wire 800. Accordingly, an electrical signal may be applied to the second pixel 220 through the detection wire 400. In an embodiment, for example, an electrical signal may be applied to the detection wire 400 by applying an electrical signal between the first pad 331 in the region A' electrically connected to the detection wire 400 or the pad corresponding to the first pad 331 in the region B' and the first pad 332 in the region A' and the pad corresponding to the first pad 332 in the region B'.

The first peripheral detection wire 460 and the second peripheral detection wire 470, which are included in the detection wire 400, are positioned outside the display area DA and are not connected by the first pixel 210 included in the display area DA. Also, the through hole detection wire 480 included in the detection wire 400 is also not connected to the first pixel 210 included in the display area DA. Accordingly, when an electrical signal is applied to the second pixel 220 through the detection wire 400, the electrical signal may be applied to the second pixel 220 independently of the first pixel 210. In addition, after the display apparatus 1 is tested, the second pixel 220 does not emit light so that the second pixel 220 may not emit light when an image is to be implemented in the display area DA.

According to the one or more embodiments described above, a display apparatus 1 capable of easily identifying whether or to what extent an emission area of pixels is reduced. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A display apparatus comprising:
a display area including a display pixel having an emission area;
a peripheral area which is outside of the display area, the peripheral area including a dam, and a first test pixel which is between the display area and the dam and has an emission area; and
an encapsulation layer in the display area and extended from the display area to the dam,
wherein the emission area of the first test pixel in the peripheral area is larger than the emission area of the display pixel in the display area.

2. The display apparatus of claim 1, wherein
the display area further includes edges which meet each other at a first corner of the display area, and
the first test pixel in the peripheral area is adjacent to the first corner of the display area.

3. The display apparatus of claim 2, wherein
the peripheral area further includes an input pad at a first side of the display area, and,
the first corner of the display area is at a second side of the display area which is opposite to the first side of the display area.

4. The display apparatus of claim 2, wherein
the peripheral area further includes a second test pixel which is between the display area and the dam and has an emission area,
the display area further includes edges which meet each other at a second corner different from the first corner of the display area,
the second test pixel in the peripheral area is adjacent to the second corner of the display area, and
the emission area of the second test pixel in the peripheral area is larger than the emission area of the display pixel in the display area.

5. The display apparatus of claim 4, wherein
the peripheral area further includes an input pad at a first side of the display area, and
the first corner and the second corner are both at a second side of the display area which is opposite to the first side of the display area.

6. The display apparatus of claim 4, wherein
the peripheral area further includes a third test pixel and a fourth test pixel each between the display area and the dam and having an emission area,
the display area further includes edges which meet each other at a third corner of the display area and edges which meet at a fourth corner of the display area, the third and fourth corners being different from the first and second corners,
the emission area of the third test pixel and the emission area of the fourth test pixel each are larger than the emission area of the display pixel in the display area,
the third test pixel is adjacent to the third corner of the display area, and
the fourth test pixel is adjacent to the fourth corner of the display area.

7. The display apparatus of claim 6, wherein
the peripheral area further includes an input pad at a first side of the display area,
the first corner and the second corner are both at a second side of the display area which is opposite to the first side of the display area, and
the third corner and the fourth corner at both at the first side of the display area.

8. The display apparatus of claim 4, wherein
the display area further includes a first edge which extends between the first corner and the second corner, among the edges of the display area,
the peripheral area further includes a fifth test pixel which is between the display area and the dam and has an emission area,
the fifth test pixel is adjacent to the first edge and between the first test pixel and the second test pixel, and
the emission area of the fifth test pixel is larger than the emission area of the display pixel in the display area.

9. The display apparatus of claim 8, wherein
the peripheral area further includes an input pad at a first side of the display area, and
the first edge of the display area is at a second side of the display area which is opposite to the first side of the display area.

10. The display apparatus of claim 1, wherein
the display pixel includes a plurality of first subpixels each having an emission area,
the test pixel includes a plurality of second subpixels each having an emission area, and the smallest emission area among the plurality of second subpixels is larger than the largest emission area among the plurality of first subpixels.

11. The display apparatus of claim 10, wherein the emission areas of the plurality of second subpixels are the same as each other.

12. The display apparatus of claim 1, wherein
the display pixel includes a first light-emitting element in the display area, and
the first test pixel includes a second light-emitting element which is in the peripheral area and on a same layer as the first light-emitting element.

13. The display apparatus of claim 1, wherein the peripheral area further includes a detection wire extended along the display area and electrically connected to the first test pixel.

14. The display apparatus of claim 13, wherein
the first test pixel includes a light-emitting element comprising a pixel electrode, an intermediate layer and an opposite electrode, and
the detection wire is electrically connected to the pixel electrode of the test pixel.

15. The display apparatus of claim 13, further comprising a substrate including the display area and the peripheral area, and facing the encapsulation layer with both the display pixel and the first test pixel therebetween,
wherein
the substrate defines a through hole, and
the detection wire extends along the substrate and includes a through hole detection wire portion which is adjacent to the through hole.

16. The display apparatus of claim 15, further comprising a transistor including:
a semiconductor layer on the substrate;
a first insulating layer covering the semiconductor layer;
a gate electrode on the first insulating layer;
a second insulating layer covering the gate electrode; and
a drain electrode on the second insulating layer,
wherein the detection wire in the peripheral area is on a same layer as the drain electrode of the transistor.

17. A display apparatus comprising:
a display area including a display pixel having an emission area;
a peripheral area which is outside of the display area, the peripheral area including a dam, and a plurality of test pixels which are between the display area and the dam, arranged along the display area and each having an emission area; and
an encapsulation layer in the display area and extended from the display area to the dam,
wherein the emission area of each of the plurality of test pixels in the peripheral area is larger than the emission area of the display pixel in the display area.

18. The display apparatus of claim 17, wherein the peripheral area further includes a detection wire extended along the display area and electrically connected to each of the plurality of test pixels.

19. The display apparatus of claim 18, wherein
each of the plurality of test pixels includes a light-emitting element comprising a pixel electrode, an intermediate layer and an opposite electrode, and
the detection wire is electrically connected to the pixel electrode of each of the plurality of test pixels.

20. The display apparatus of claim 18, further comprising a substrate including the display area and the peripheral area, and facing the encapsulation layer with each of the display pixel and the plurality of test pixels therebetween,
wherein
the substrate defines a through hole, and
the detection wire extends along the substrate and includes a through hole detection wire portion which is adjacent to the through hole.

* * * * *